United States Patent [19]

Umeda et al.

[11] Patent Number: 5,544,348

[45] Date of Patent: Aug. 6, 1996

[54] SIMULATION METHOD AND APPARATUS

[75] Inventors: Shigeki Umeda, Kawasaki; Hirofumi Yoshikawa, Inzai-machi, both of Japan

[73] Assignee: International Business Machines Corporation, Armonk, N.Y.

[21] Appl. No.: 210,112

[22] Filed: Mar. 17, 1994

Related U.S. Application Data

[63] Continuation of Ser. No. 724,624, Jul. 2, 1991, abandoned.

[30] Foreign Application Priority Data

Jul. 3, 1990 [JP] Japan ..................................... 2-174642

[51] Int. Cl.⁶ ...................................................... G06F 9/455
[52] U.S. Cl. .......................... 395/500; 364/221.2; 364/222; 364/232.3; 364/264.3; 364/DIG. 1
[58] Field of Search .............................. 395/500; 364/578

[56] References Cited

U.S. PATENT DOCUMENTS

| | | | |
|---|---|---|---|
| 4,841,479 | 6/1989 | Tsuji et al. ................................ | 395/500 |
| 4,901,260 | 2/1990 | Lubachevsky ............................ | 364/578 |
| 4,965,743 | 10/1990 | Malin et al. .............................. | 364/513 |
| 5,019,961 | 5/1991 | Addesso et al. .......................... | 364/192 |
| 5,133,045 | 7/1992 | Gaither et al. ............................ | 395/51 |

*Primary Examiner*—Kevin J. Teska
*Assistant Examiner*—Ayni Mohamed
*Attorney, Agent, or Firm*—Mark E. McBurney; Richard A. Henkler

[57] ABSTRACT

A method and apparatus is provided to simulate a system that is modelled by object frames which describe information on the events to be processed by the system, and a root frame that contains information on the conditions and times of the simulation. The first step is to search for an (accidental simultaneous state-events) object, which causes an event at the time prescribed by the root frame, by sequentially referring to the scheduled occurrence times of the events so as to execute simulation of the object, the second step is to list the events (intentional simultaneous state-events), which simultaneously occur with the searched-for object, referring to a simultaneous state-events rule, so as to execute simulation of an object causing the event, and the first and the second steps are repeatedly executed until completion of the simulation time, by updating the time of the root frame when processing of both steps is complete for all objects searched for in the first step.

14 Claims, 14 Drawing Sheets

SIMULATION METHOD AND APPARATUS

This is a continuation of application Ser. No. 07/724,624 filed Jul. 2, 1991, now abandoned.

BACKGROUND OF THE INVENTION

1. Field of the Invention

This invention relates to a simulation method and apparatus, and more particularly to a simulation technique suitable for processing discrete events in a production system, a physical distribution system or the like.

2. Description of Related Art

Computer simulation provides various prediction information that is used as guidelines for the management and operation of a system. It is known to model and simulate complicated systems such as the production system of a plant, a wide area transport system for goods, or a transportation system. Types of simulation include: continuous time type and discrete time type simulation which focus on time; and discrete event type simulation which focuses on the actions of objects. A production system, transportation system or the like, as mentioned above, is suitable for being simulated as a discrete event type of system wherein the actions of the objects occur in a discrete manner, and no change occurs between them. For example, JA Published Unexamined Patent Application (PUPA) No. 61-61752 discloses a simulation system for a manufacturing facility. Also, JA PUPA No. 1-155462 (U.S. Pat. No. 4,901,260) discloses a system for improving the efficiency of discrete event type simulation.

However, the various systems mentioned above become more and more complicated every year, and therefore conventional simulation systems cannot fully cope with such situations.

That is, using conventional methods for a complicated system requires enormous efforts to describe an algorithm for processing simultaneous state-events, and a great deal of time is required for processing the simulation with a computer system.

When a production system is considered from the viewpoint of simulation, its most significant feature is that simultaneous state-events are very frequently caused. Simultaneous state-events are events, such that different events occur in series in a subject system at the same time. For example, at the same time a work-in-process exits from a buffer, another work-in-process is unloaded from a machine being blocked. At the same time when the quantity of work-in-process becomes less than a reference quantity for inventory, a "Kanban" (signboard) is removed. At the same time when the Kanban is removed, a supply cart starts to move toward the previous process. When a work-in-process is delivered to the buffer from the previous process, a crane starts to operate.

Such an operation is basically one in which a first object causes a specific event, and then another object that has had no previous relationship with the first object causes another event. Generally, in principle, a simulation language describes the details of the behaviors of each object. Therefore, complicated steps become necessary to retrieve the simultaneous state-events, it is very difficult to describe the mechanisms, and cases frequently arise where operations cannot be fully described because of limitations of the language. Because the steps become complicated in this way, an enormous amount of time is also required for the simulation processing by a computer.

In addition, a conventional simulation system requires time and labor to create a simulation model (description of the processes and procedures). This is not limited to the discrete event type, but is common to all simulation systems covering a complicated system.

Conventionally, to perform such a numerical experiment on a computer system, there is no set approach, rather, the structure, the operation procedures and the like of the subject production process are described one after another by using a general-purpose language such as FORTRAN or PL/I. Even if the languages are somewhat easier to describe, they are described in the same manner by using a simulation language such as GPSS. Many simulation languages, such as GPSS, are provided with several descriptive elements for describing a system, and there are methods to fully utilize these descriptive capabilities to correlate the subject system with a model. However, because these languages are designed to be extensively used not only with production systems, but also with communication networks, transportation systems and the like, the descriptive elements are provided in a very abstract forms such as TRANS, ACTION, QUEUE, or ENTITY. Therefore, in order to describe real components such as machines, conveyors, supply cars, cranes and workers, it is necessary to first finely decompose their arrangements, actions and the like into a form usable with such abstract descriptive elements, and to then reconstruct them. Such an operation requires an enormous amount of time and labor.

In addition, in cases where information is exchanged between components, this exchange cannot be exactly reflected in the model, or an enormous amount of time and labor is required to implement the exchange.

There are two types of systems for giving orders as to the connections between the components of a production system, the push type and the pull type. The push type ordering system is a system in which each process performs operations based on a previously instructed plan, and the work-in-process which has been completed for an operation is sequentially "pushed" to the following process. This system assumes the existence of a scheduler that controls the entire system. The scheduler estimates lead times, taking into consideration the goal and capabilities of each process, and orders each process. Each process performs its production based on these orders, and sequentially "pushes" the work-in-process to the next process. The push type system can be also called a plan driven type. An MRP (material requirement calculation program) is a typical example of this.

On the other hand, the pull type ordering system is a system in which the next process "pulls" a work-in- process from the previous process. The chain is sequentially caused to go backward to the previous process in a manner such that each process takes up work-in-process and raw materials "as required." Because a "Kanban" is frequently used as a means for communicating the pull information to the previous process, this system is also called a kanban system. A production site will appropriately use the MRP system and the kanban system according to their characteristics. Sometimes, a production ordering system combining the MRP system and the kanban system is used.

There is no known general-purpose simulator for easily modelling production processes that can be defined with the MRP system or the kanban system as a model. If the intent is to express such a production ordering system with a general-purpose simulation language, an enormous amount of model development cost arises. Sometimes, such a model description is not allowed because of the design specifications of the language.

SUMMARY OF THE INVENTION

The first object of the invention is to provide a discrete type simulation method and related apparatus that makes it easy to describe the processing algorithm for simultaneous state-events frequently occurring in a complicated system, and enable efficient processing. Another object of the invention is to provide a modelling structure with which the operation of creating a simulation model is easily and rapidly performed. To attain the first object of the invention, the simulation method of the invention has the following features.

A method for simulating the behaviors of a system, having a plurality of interacting frames, and having a chain in which an event occurring in one of the frames affects another one of the frames. This method includes a step for simulating an event that occurs at a simulation time for one of the frames, and is limited to an event having an intentional chain with the event to be simulated.

To attain another object, the simulation modelling structure for simulation includes object frames describing information relating to events to be processed by a system, a root frame having a pointer group pointing to a list of the object frames and containing information on the conditions and times of simulation, and a plurality of event tokens connected to the object frames with bidirectional list pointers.

First, a system to be simulated is modelled by object frames that describe information on the events to be processed by the system, and a root frame that contains information on the conditions and times of the simulation. Then, the first step is to search for an (accidental simultaneous state-events) object, which causes an event at the time prescribed by the root frame, by sequentially referring to the scheduled occurrence times of the events so as to execute simulation of the object. The second step is to list the events (intentional simultaneous state-events), which simultaneously occur with the searched for object, referring to a simultaneous state-events rule, so as to execute simulation of an object causing the event. The first and the second steps are repeatedly executed until completion of the simulation time, by updating the time of the root frame when processing of both steps completes, for all objects searched for in the first step.

Therefore, in accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

This invention will be explained regarding an example wherein the invention, is applied to simulation of a manufacturing process.

Figure 1:
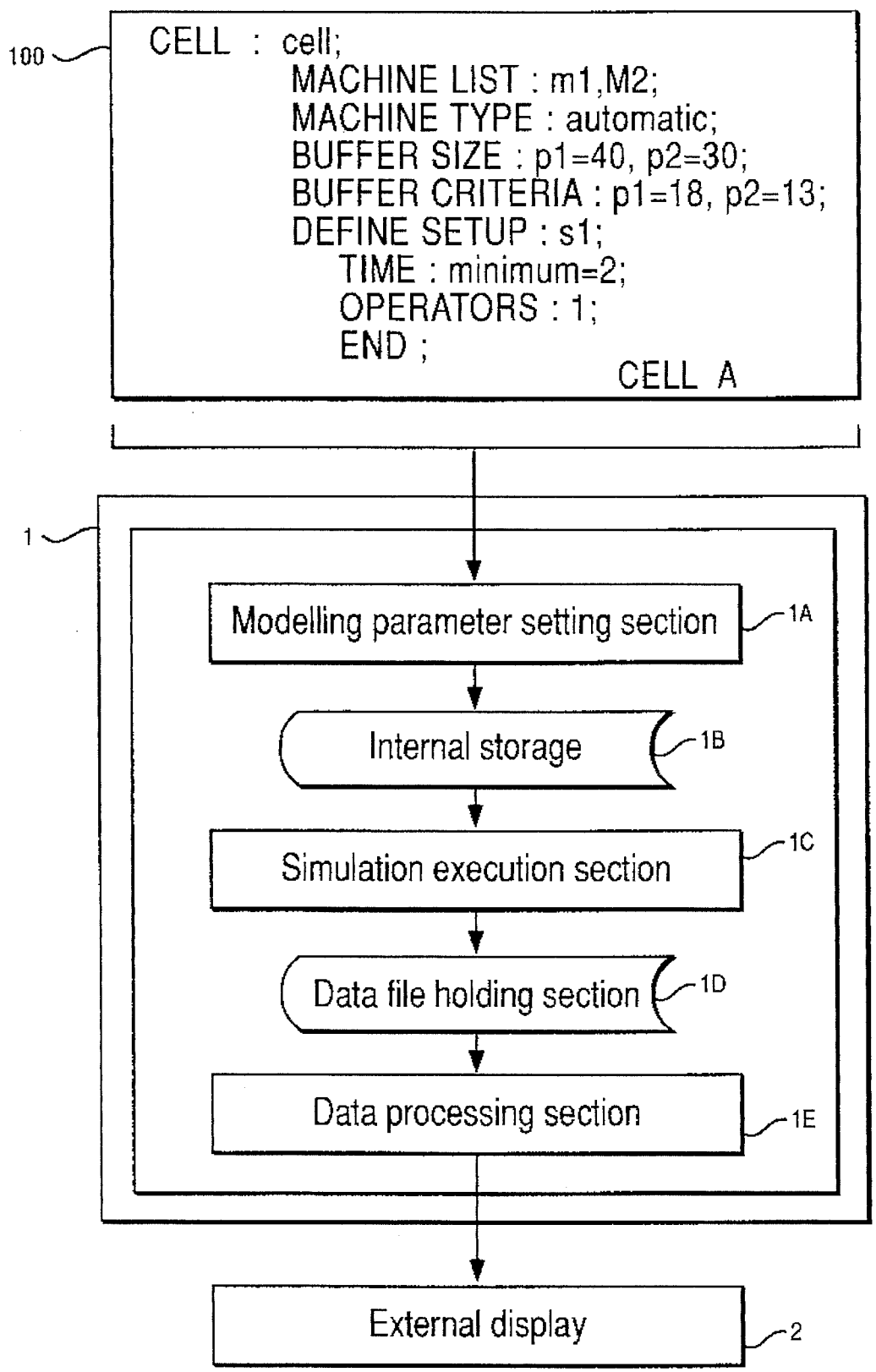
FIG. 1 shows a schematic view of a simulation apparatus according to an embodiment of this invention.

First, an overview of the simulation apparatus is described by referring to FIG. 1. There is a discrete simulation function section 1 consisting of five sections. There is a modelling parameter setting section 1A which is a section for setting parameters that determine the specifications of the structure of a production process, subject to the simulation specified by a modelling cell 100, and the conditions for execution of the simulation. The specifications of the structure are in a form that can be easily written up by an engineer, not a simulation professional, e.g. production system or process design professional.

The structure of the production process, subject to the modelling parameter setting section 1A and the parameters required for executing the simulation, are constituted in the form of a network consisting of nodes and pointers, and are developed in the internal storage of a computer 1B, and the access pointers are passed to a simulation execution section 1C. The simulation execution section 1C generates a list of tokens corresponding to the objects that are the individual resources of the production system, that is, each of the machines, transportations, workers, parts and the like, and generates a record of the events that occur in the system, by tracing (tracking) them with this list and a pseudo random number generator.

The events are the changes of state in each object, such as when a machine starts operation, or when a machine completes conveyance. There are two types of records. One is a cumulative calculation record for finding the distribution of the times of the objects by operation, such as the operating times of machines, the times for changing arrangements, the times for repairing faults, or the transportation times by transporting equipment. The second record is an input/output record of the parts to be processed and/or assembled to and from the machines and transporting equipment. The records thus obtained are outputted to a data file holding section 1D as an external file in the form of an intermediate data file (not shown). The times for processing the events of each object (such as machines and transporting equipment) are determined by random numbers that are found by the congruential multiplication method. Therefore, the results of the simulation are affected by the series of random numbers, and, to solve this, the apparatus incorporates a replication function that executes simulation several times under the same execution conditions by changing the series of the random numbers. Outputted to the data file holding section 1D is the data from the several simulations that have been executed.

A data processing section 1E finds the distribution of the operating times by system resource from the intermediate data outputted to the data file holding section 1D by the statistical inference method, and calculates evaluation scales. The evaluation scales are: time distribution by operation type of resource, time series accumulation values of the number of parts processed by each resource, and time series staying quantity of the parts in the process staying in each resource. Data processed by the data processing section 1E is sent to and displayed on an external display 2 as numerical information and image information.

It can be seen that many commercially available data processing systems can be utilized by the present invention. For example, a RISC System/6000 with adequate memory for internal storage 1B can be used to implement the present invention. Additionally, an operating system, such as the AIX system (RISC System/6000 and AIX are trademarks of IBM Corporation) and related peripheral devices are included, e.g. keyboard, mouse, and the like. Further external display numeral 2 may include a CRT monitor, or the like. Of course, it will be understood that many other hardware and software, computer system configurations can be utilized to implement the present invention.

Now, the arrangement and functions of each section of the discrete type simulation function section 1 will be explained in order.

In the modelling parameter setting section 1A, first, the process organization of a production system is described with a frame representation.

Figure 2:
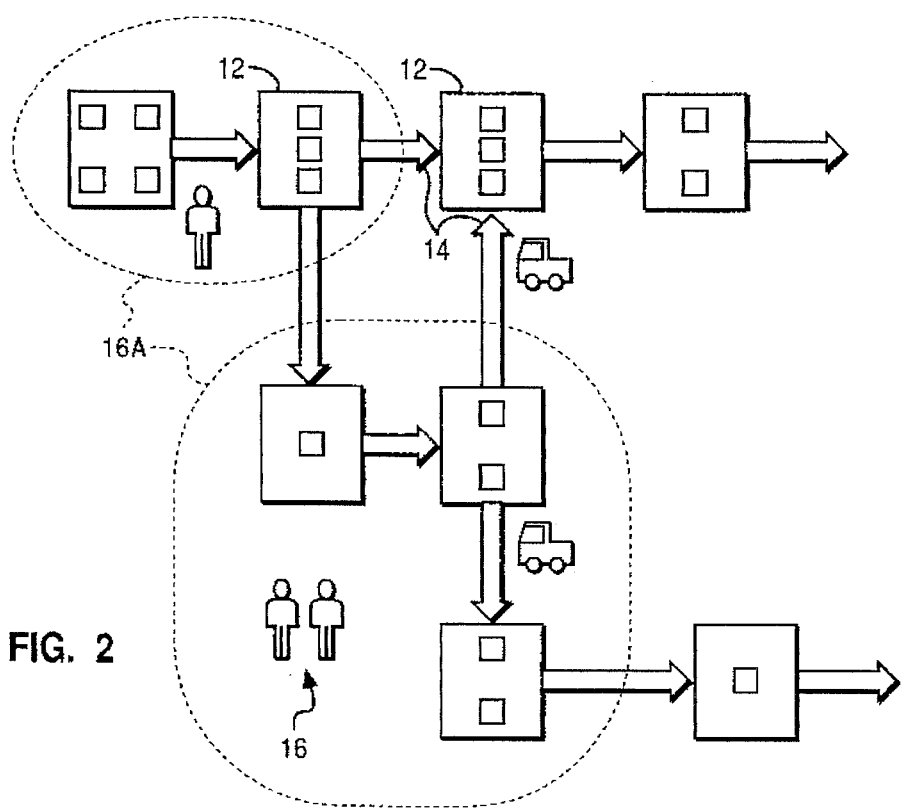
FIG. 2 shows relationships between cells, trans and operators, all of which are modelling descriptors.
Figure 3A:
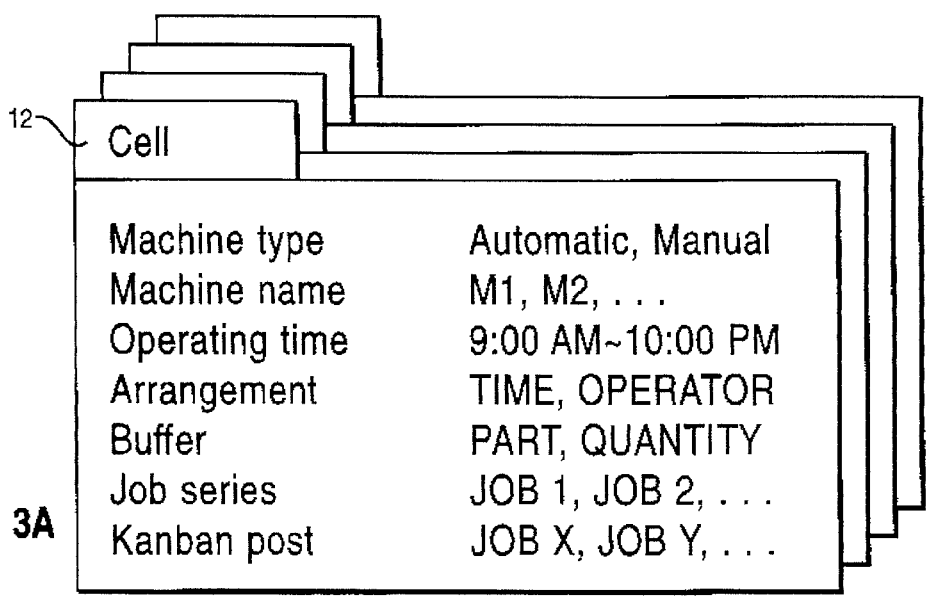
FIGS. 3(a)–3(c) show diagrams illustrating the details of each of the cells, the trans and the operators of FIG. 2.
Figure 3B:
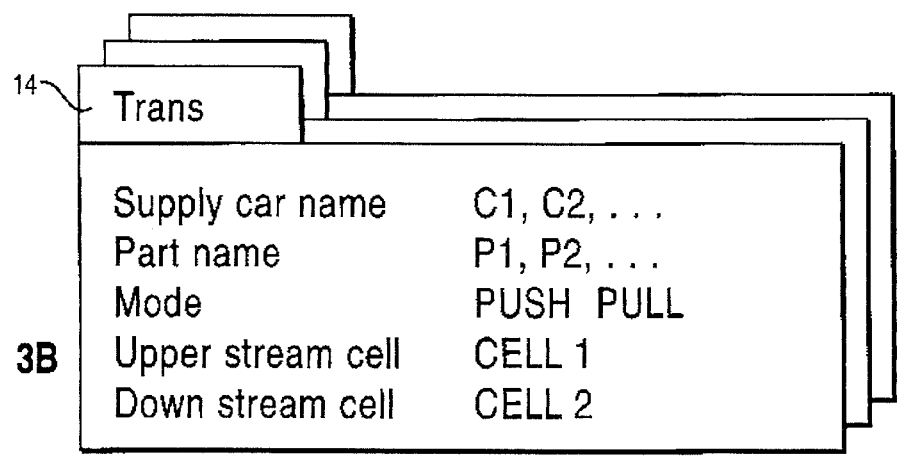
Figure 3C:
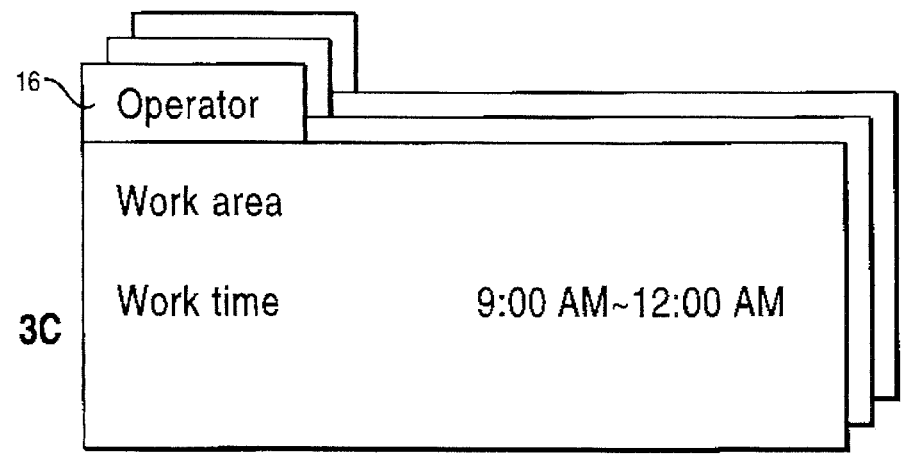

Although there are many types of production systems, and it is impossible to provide a framework covering all of them, the types of components of a production system are relatively limited in number. Typical components are provided to be used as the framework of a model (modelling descriptor). The modelling descriptor is a descriptive element to describe the arrangement of a production system with a network structure. A node of the network is called a cell, and an arc is called a trans. In addition, there is an operator representing a worker as a resource common to the cell and the trans. FIG. 2 shows the relationships between the cell 12, the trans 14 and the operator 16. FIG. 3 shows an example of each descriptive element when data representing the element is organized for use by the computer system.

At the cell 12, there are three modelling descriptors, that is, a production cell for performing the processing and assembly of a product, a carry-in cell for carrying in raw material, and a carry-out cell for carrying out a finished product, or the like. The trans 14 is a modelling descriptor representing a transporting system, and is basically an element connecting two cells 12. The operator 16 is a modelling descriptor representing a worker who performs the operation of a machine, the operation for repairing a fault, or an arranging operation at the production cell.

The descriptor for each cell 12, trans 14 and operator 16 is represented in a unique table form. That is, the table consists of attributes (slots) and their values (facets, and data), as shown by the example of Table 1, and describes an object to be described. It is then possible determine the slot structure suiting the arrangement of the production system. If a value is undefined, it is convenient for rapidly creating a rough model, because the table system is designed to use a missing value, which is prepared in advance.

TABLE 1

| Example of description of a modelling descriptor | |
|---|---|
| CELL:cell; | |
|   MACHINE LIST: m1, m2; | |
|   MACHINE TYPE: automatic; | Resources |
|   BUFFER SIZE: p1=40,p2=30; | |
|   BUFFER CRITERIA : p1=18,p2=13; | |
|   DEFINE SETUP: s1; | |
|     TIME: minimum=2; | |
|     OPERATORS: 1; | |
|     END; | |
|   DEFINE SETUP:s2; | |
|     TIME: minimum=2.5,average=3; | Operations |
|     OPERATORS: 2; | |
|     END; | |
|   DEFINE WORK:WT1; | |
|     SETUP: s1; | |
|     TIME: minimum=3,average=4; | |
|     INPUT TYPE:p1=3; | |
|     OUTPUT TYPE: p2=6; | |
|     END; | |
|   DEFINE WORK:WT2; | |
|     SETUP: s2; | |
|     TIME: minimum=2,average=2.2; | |
|     INPUT TYPE:p3=1; | |
|     OUTPUT TYPE: p4=1; | |
|     END; | |
|   DEFINE JOB: J1; | |
|     WORK TYPE : WT1; | |
|     REPEAT : 5; | |
|     END; | |
|   DEFINE JOB J2; | |
|     WORK TYPE : WT2; | |
|     REPEAT : 7; | |
|     END; | |
|   INIT BUFFER: p1=20,p2=15; | Initial |
|   INIT SETUP : m1=s1,m2=s2; | conditions |
| END | |

The methods for describing various cells, trans and operators will now be described.

(1) Description of Production Cell

As shown in Table 2, a production cell consists of three slots, a slot relating to system resources, a slot relating to operations and a slot relating to initial value setting. The system resources include machines and buffers. A plurality of machines with the same performance can be set with one cell.

Definition items for the machine include installed machine names, types of machines, and machine fault attributes. The machine types include the manual operation type that requires an operator for its operation, and the automatic operation type that does not require an operator. The machine fault attributes include the probability of faults, the parameters of repair time distribution, and the number of workers required for repair.

It is possible to set up a product-in-process shed (buffer) between processes, for which a size and an inventory reference value (a trigger for sending a take-up signal to the previous process when inventory becomes less than its value) can be defined. The buffer types include an inherent buffer and a shared buffer. The inherent buffer is one for which the capacity is determined for each individual work-in-process, while the shared buffer is one shared by several work-in-process. Both the inherent and the shared buffers can be defined along with their capacities. Because a multiple product production system produces a plurality of products on the same production line, for each process, it is necessary to define the details of separate types of work corresponding to the products to be produced, and the operations required to produce the product, such as the arrangement work. The operations include arrangement information, work information, definition of JOB, and definition of JOB series. Multiple sets of these may be defined in correspondence with a multiple product production system.

TABLE 2

Description frame of production cell

| Resources | Machines | Installed machine name, Type (automatic operation, manual operation) Fault attributes (probability of fault, repairing time, distribution parameters, number of workers for repair) |
| --- | --- | --- |
| | Buffers | Buffer size (inherent, shared) Inventory reference volume in buffer |
| Operations | Arrangement information | Arrangement name, arrangement time distribution parameter, number of workers for arrangement |
| | Work information | Work name, names and number of inputted parts, names and number of outputted parts, work time distribution parameter |
| | JOB information | JOB name, work name, number of times work is repeated |
| | JOB series | Sequence of execution of JOB |
| Initial conditions | | Initial arrangement state of machine, initial inventory state of buffer |

The arrangement (initial condition) information includes definitions of inherent arrangement, arrangement time distribution parameters, and the number of workers for arrangement work. The work information includes work name, work time distribution parameters, the names of inputted parts, and the names of outputted parts. The arrangement work time distribution and the work time distribution are assumed to follow a shift type exponential distribution by taking the characteristics of the production system into consideration.

This time distribution is represented by equation (A) with parameters of $\mu$ and m.

$$f(x) = 1/(\mu - m)\exp(-(x - m)/(\mu - m)) \quad (A)$$
$$= 0$$
$$(x > m)$$
$$(x < m)$$

(A) takes the form of exponential distribution $$g(x) = \lambda \exp(-\lambda x)$$

(B) shifted in the direction of the x-axis with $\lambda = 1/(\mu - m)$.

Therefore, (A) has an average of $\mu$ and a standard deviation of $1/(\mu - m)$, and its distribution type is an exponential distribution. Usually, a queue network analysis system (QNA), such as for a communication system, frequently uses g(x) represented by equation (B) as the time distribution for service time. In equation (B), the range of service time is [0, ∞]. The work time in each process of a production system is a time value with a relatively small variation requiring a minimum process time. According to the definition of (A), the work time satisfies this condition, and it also has the characteristics indicated by the exponential distribution. Therefore, when a production system is considered, it has reality and expandability.

A multiple product production system uses a production scheme that performs processing by a lot unit determined for each process. According to the system of the invention, the concept of a lot is reflected in the simulation model in the form of a JOB definition. One JOB consists of a cycle of several work steps. With this definition, each lot unit of the production system can be easily represented, and it is useful for determining the proper size. In addition, if an arrangement of JOBs in the order of execution is defined as a JOB series, the order of execution of JOBs is specified. Furthermore, initial values can be set, such as the initial arrangement of the machines, and the initial inventory amount of buffers.

(2) Description of Carry-in/carry-out Cell

The carry-in/carry-out cell is a cell for carrying in, or out finished products and raw materials to, or from the outside. Table 3 shows an example of a description frame. It may also represent a vendor (pre-process) or a customer (post-process). It is possible to define four types: a plan type, a cyclic type, an order type and a distribution type. The carry-in and the carry-out cells and the entrance and the exit cells are defined with exactly the same form.

The plan type carries, in or out only a predetermined amount of a finished product, or the raw materials of a predetermined item at a predetermined time based on a given carry-in/carry-out plan list. The cyclic type describes the work of carrying in and out the raw materials/finished product of a predetermined item in a predetermined amount at a constant time interval.

In the order type, a lead time and carry-in/carry-out amount are set in advance, and when a carry-in/carry-out order is issued, the work is performed after the lead time has expired.

In the distribution type, the item and amount of work-in-process of carry-in/carry-out is constant, as in the cyclic type, but the time interval follows a probability distribution. In addition, there is a slot for describing buffers of the same types as described previously i.e. shared/inherent buffers.

TABLE 3

Description fram of carry-in/carry-out cell

| Resources | Buffers | Buffer size (inherent buffer size, shared buffer size) Inventory reference amount in buffer |
| --- | --- | --- |
| Operations | Types | Plan ¦ cyclic ¦ distribution ¦ order |
| | Work steps | (Plan type) Carry-in/carry-out plan list (Cyclic type) Cycle time Carry-in/carry-out item list (Distribution type) |

TABLE 3-continued

| | Description fram of carry-in/carry-out cell | |
|---|---|---|
| | | Time interval |
| | | distribution parameters |
| | | Carry-in/carry-out list |
| | | (Order type) |
| | | Order list |
| | | Lead time/ |
| Initial state | Initial state of buffers | |

(3) Description of Trans

As shown in Table 4, a frame of a trans consists of three, slots one relating to the system resources, one relating to the linke information, and an operation. Resources include a cart used as transporting equipement. For each cart, the name of the product-in-process to be loaded and the loading amount is determined, which corresponds to the definition of conveying amount per cycle, or, the conveyance lot. The lot size and the conveying capability between processes can be evaluated together with the conveying time.

The trans is for linking two cells, i.e. the linking information for which a cell in the upper stream and a cell in the down stream are defined. Information for operations includes moving time, loading/unloading time, and types of operations. The types of operations include the PUSH type and the PULL type. The CART of the trans of the PUSH type has the upper stream as its base position, and loads and transports the work-in-process when a quantity sufficient for loading is accumulated. After unloading them at the down stream, it returns to the upper stream in an empty state. The CART of the trans of the PULL type has the down stream as its base position, and goes to the upper stream while it is empty to receive the work-in-process when the remaining quantity of the work-in-process becomes less than a predetermined reference quantity. After loading them in the upper stream, it returns to the down stream. If the quantity of the work-in-process in the upper stream is less than the reference quantity, a JOB is requested of the cell in the upper stream.

TABLE 4

| | Description frame of trans | |
|---|---|---|
| Resources | CART | Cart name |
| Link information | | Name of product-in-process to be loaded |
| | | Loading quantity |
| | | Name of cell in the upper stream |
| | | Name of cell in the down stream |
| Operations | Type | PUSH, PULL |

(4) The operator has the function of assigning workers when the cell and the trans require them. It is also considered to be a system resource when the cell and the trans operate. As shown in Table 5, the frame of an operator consists of the name of each worker belonging to it, the cell name of a subject area of work (16A in FIG. 2), and a slot of work time. They can be independently fefined for each frame so that lunch breaks for the workers, work shifts and the like can be reflected in the simulation of the acutal situatuion of the production system.

Therefore the proper positioning of the workers, the assignment of work time and the like can be evaluated.

TABLE 5

| | Description frame of operator | |
|---|---|---|
| Resources | Workers | Name of workers |
| Operators | | Work time zone |
| | | Work area |

(5) Description of Production Order System i) Description of Push Type Production Order System A production order from a scheduler is defined for all the production cells consitituting the production system in the JOB sequence, to prescribe the order of the execution of the JOBs. In addition, the type of trans connection the cells is set to the push type.

ii) Description of Pull Type Production Ordering System

The pull type production instruction system essentially repeats a cycle in which the previous process knows what the next process receives (will receive), and the previous process performs its operation as required. Therefore, to simulate the pull type production ordering system, the following two items are necessary and sufficient:

1) To describe the timing when the next process sends a production order; and

2) To describe the process in which the previous process performs the production according to the production order from the next process.

Instead of defining the JOB sequence for all the cells constituting the production system, the inventory reference quantity is defined for the input/output buffer. In addition, the type of the trans connecting processes is set to the pull type.

iii) Description of Push/pull Mixed Type Production Ordering System

A JOB sequence is defined for only those cells constitutuing the production system that receives production orders from the scheduler, so as to prescribe the order of the execution of the JOBs. The trans immediately following the cells for which the JOB sequence is not defined is set to the push type. Other trans may be either the push type of the pull type.

The modelling parameter setting section 1A (FIG. 1) then describes simulation execution conditions by using frame representations.

The details are as follows:

(1) Execution Time Of Simulation

The executuion time of the simulation is specified by actual time units.

(2) Replication Time (REPLICATION)

The number of replication of simulation is specified.

(3) Trace (Tracking) Information

The machines and the carts, as well as the cell names and the trans names which include them are specified.

(4) Event Occurrence Recording Conditions

The event occurrence record can provide a log of all events that occurred during the simulation if there is no specification by the user. If specific cells and trans are specified, it provides output only on these cells and trans.

(5) Deletion of Initial Data

Figure 4:
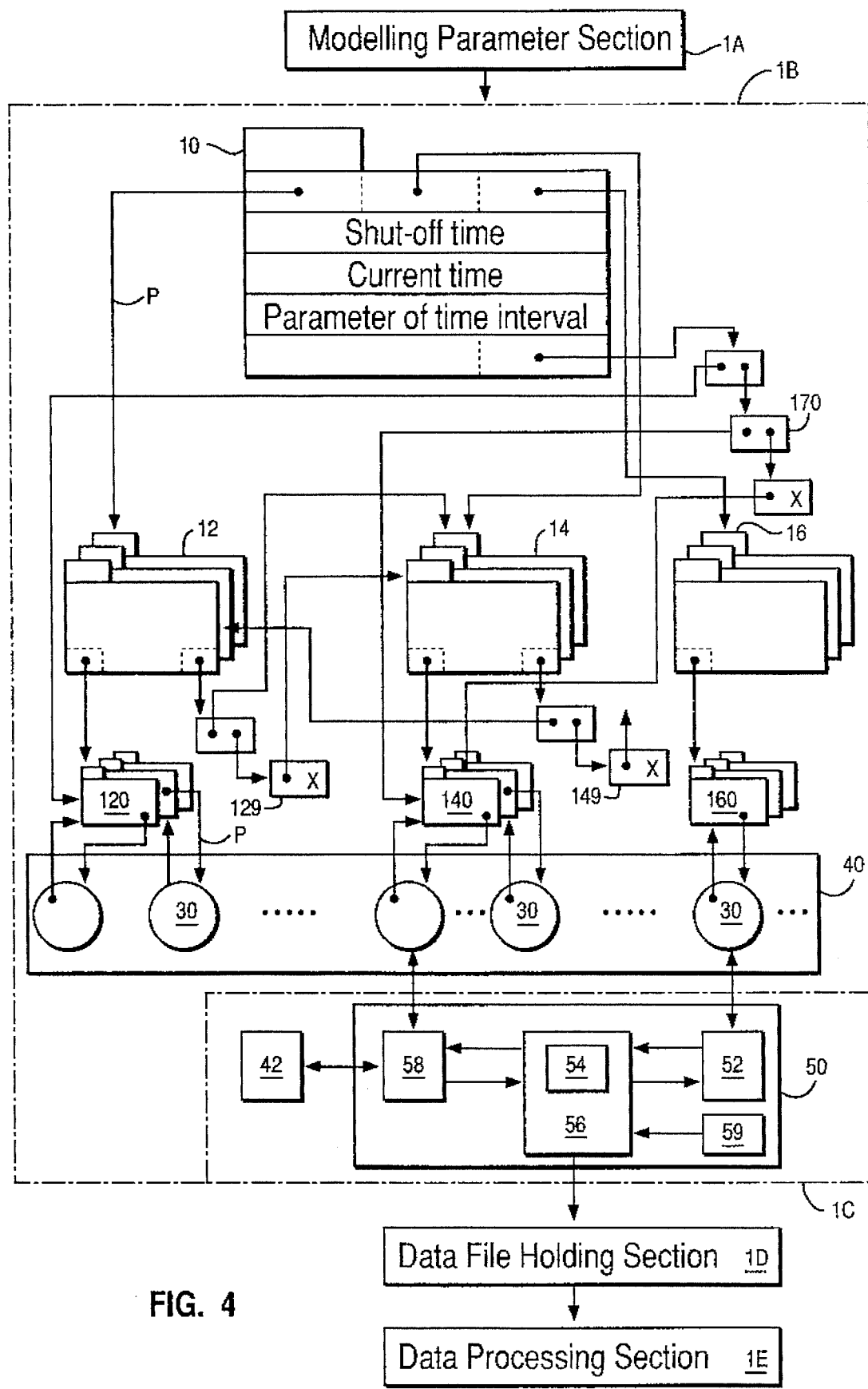
FIG. 4 shows details of the simulation apparatus of FIG. 1.

In a case where it is desired to exclude from the analysis, data for some time interval starting from the beginning of the simulation, that interval is specified. The internal storage 1B performs the internal development of the process organizing information and the simulation execution conditions. The contents of the description itself of each element of the production system, that is, the production cells, the machines, the carry-in cells, the carry-out cells, the carts, and the operators have a data structure in the frame form as shown in FIG. 3. The data structures are developed into the internal storage 1B of the computer system as shown in FIG. 4. At that moment, a root frame 10 is generated.

The root frame 10 is a frame defined with procedures covering all object frames, that is, the minimum unit of each node, arc, and common resources in the system network. The root frame holds as data the simulation shut-off time, the current time of day, a time interval parameter and a node parameter (when collecting data), a node parameter for tracing the simulation, and a pointer group pointing to a list of parent frame groups (the cell 12, the trans 14, and the operator 16).

The object frames are arranged according to the three types of the cell, the trans and the operator. An arranged object frame is a parent frame. Therefore, a parent frame has one or more object frames. The parent frame is described with characteristics common to the object frames belonging to it (child frame groups 120, 140 and 160). This means that the characteristics of an object frame are described in itself, and characteristics common to its children are described as those of the parent frame.

The root frame and the parent root frame group, as well as the parent root frame group and the child frame group have bidirectional pointers P, referring each other, and can send, or receive, data to, or from, an object frame other than itself through the parent frame as required. In addition, the frames of the cell and the trans have related frame lists 129 and 149 which particularly relate to themselves (the frame of a trans relates to a cell, and the frames of cells at the upper stream end, and the down stream end of a trans relate to the intermediate trans) so that they can directly search for each other from lists 129 and 149.

If there is a relation such that an arc (Ai) starts from a node (Ni), the related frames under the parent frame representing Ai include related frames for which the contents "Ni; a node being a start point of Ai" is described.

Figure 5:
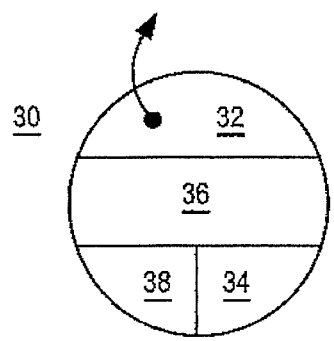
FIG. 5 shows an example of an event token used by the apparatus of FIG. 4.

These child frame groups (the machines, the carts, the conveyors, and the operators 120, 140, 160) are concrete "objects that may cause events" and which actually exist in the system, and are connected to event tokens 30 by bidirectional lists. The event token is a key (index) for referring to each object. As shown in FIG. 5, the event token 30 is written with a state variable area 38 for the token, an access pointer 32 (pointing to a corresponding object frame), a waiting state mark area 36 and an event number and the planned time 34 that the object will cause the next event. The event token 30 is usually stored in a column of a variable length table 40 that is called a time event table (TET).

The internal storage 1B of the computer system also stores the data of a simultaneously occurring event rule collection 42, which will be described later. Trace list 170 (FIG. 4) is used to view the operation of a specific object.

The simulation execution section 1C is the section that becomes the core in executing the simulation. The event processing processor 50 constitutes a simulation execution section with a plurality of functional components such as an event occurrence search device 52, an event processor 56, containing an event processing stack 54, a simultaneous state-events search device 58, and a pseudo random number generator 59.

The event occurrence search device 52 searches the time event table 40 stored with the event token 30 to find the most recent scheduled time for the event occurring next. Also, it searches tokens having events occurring at the same time as that event, retrieves all applicable tokens, and loads them in the event processing stack 54 in the event processor 56.

The event processor 56 fetches the tokens 30 loaded in the event processing stack 54, performs applicable processing, and passes them to the simultaneous state-events search device 58. When all the tokens 30 loaded in the event processing stack 54 are processed, and the stack becomes empty, the simulation time T in the root frame 10 is updated.

The simultaneous state-events search device 58 searches the object frames 120, 140 and 160 corresponding to the tokens 30, their parent frames 12, 14 and 16, and the related frames 129 and 149 that the parent frames have. The search device 58 also searches the simultaneous state-events and objects applicable to them by referring to the simultaneous state-events rule 42.

Figure 6:
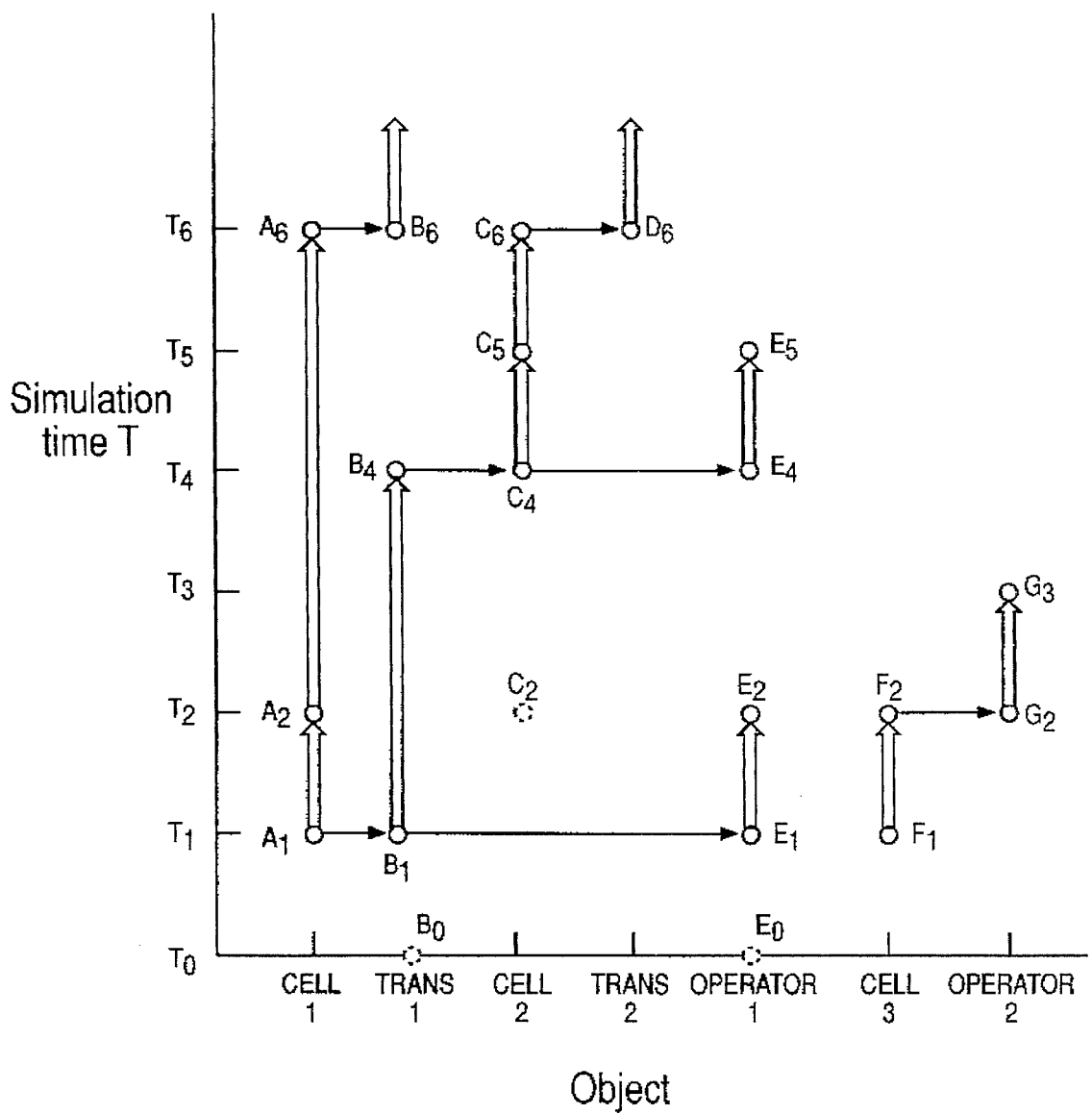
FIG. 6 shows a diagram for illustrating simultaneous state-events.

There are two types of simultaneous state-events. One is the accidental simultaneous state-events, and the other is the intentional simultaneous state-events. They are described by referring to FIG. 6. The axis of abscissas of FIG. 6 represents each object, while the axis of ordinates represents the simulation time T. The circles with symbols A1–G3 indicate events. A double line indicates the continuation of an event, while a single line indicates a chain relation i.e. an interelated or linked relationship. Accidental simultaneous state-events means a case where two or more events accidentally occur at the same time. In FIG. 6, events A1 and F1 at the time T1 are examples of this. On the other hand, intentional simultaneous state-events is an event that is intentionally caused when an event occurs. Examples of the intentional simultaneous state-events in FIG. 6 include:

B4; a work-in-process enters into the input buffer ->C4; a machine waiting for material starts to move. C5; a machine executing a job completes the work ->C6; the work-in-process enters into the output buffer. C6 the work-in-process enters into the output buffer ->D6; the product is loaded on a supply cart waiting for material:. And F2; a machine in operation fails ->G2; an operator starts repair work.

Once a system configuration is determined, it should be possible to make limitations on what sort of events occur, and the type of events that are possible to occur when events are chained with other events. The simultaneous state-events rule collection describes this in a rule form. This means that the simultaneous state-events rule collection describes the patterns of intentional simultaneous state-events. Examples of rules include:

A machine object performs output to the buffer ->Search for a supply cart waiting for input in the down stream of the cell to which the machine belongs.

An operator is released as a machine object completes an arrangement change

->Search for a machine that has failed and is waiting for repair.

or

->Search for a machine that is waiting for an operator for changing an arrangement.

Figure 7:
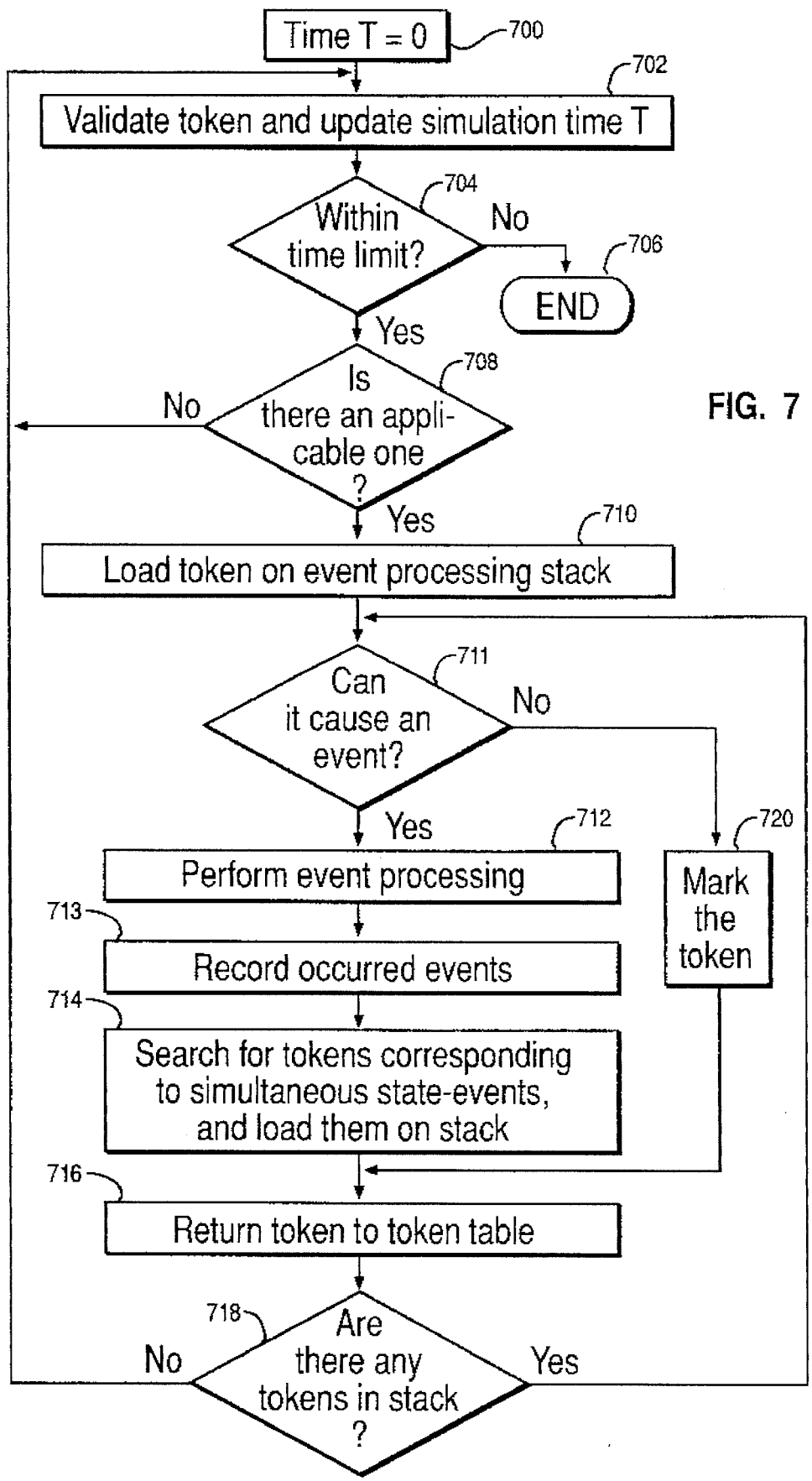
FIG. 7 shows a processing algorithm for the event processing processor of FIG. 4.

The simulation is executed, as shown in FIG. 7, under the following algorithm:

(1) First, set the current simulation time T of the root frame to zero (step 700).

(2) Then, perform a search for tokens 30 and update the simulation time T at step 702. The event occurrence search device 52 searches the tokens 30 in the token table 40 in sequence, finds the events occurring next and their occurrence time by making the time interval to the event occurring next a minimum, and causing the simulation time to proceed within that time period. During this search, the tokens with a mark in the waiting state mark area 36 are excluded from the subject of the search. In the example of FIG. 6, tokens corresponding to the events A1 and F1 are extracted by the search at the time T1, and the tokens corresponding to the events B0 and E0 are excluded from the subject (mark in waiting area 36).

(3) Next, the present invention compares the simulation time with the current time T of the root frame (step 704), and terminates the simulation if T exceeds the simulation shut-off time (step 706). Otherwise, the process goes to step 708.

(4) In step 708, it is determined whether or not any applicable tokens 30 are found by the search, and if not, the process returns to step 702. If there is token, load the token in the event processing stack 54 in the next step 710.

(5) The event processor 56 traces the frame pointer 32 connected to the token 30 in step 711, interprets the state, and determines whether or not a scheduled event can be caused. There are cases where the scheduled event cannot be caused because of the state of the system at that moment. For example, the cell 2 of FIG. 6 is in a chained relationship to the trans 1, and cannot independently execute the event C2 at the time T2. At that moment, a mark is placed onto the waiting state area 36 of the token 30 corresponding to the event C2 (step 720). This means that an object pointed to by this token enters into a waiting state. Similarly, the events B0 and E0 (FIG. 6) at the time T0 are in a waiting state.

(6) In step 712, a frame pointer connecting the token is traced to execute the event processing. If there is any change in the state of the system as the result of the event processing, the contents of the frame and the value of the state variable indicating the state of the frame are updated. The event processing will be described later in detail.

(7) In step 713, occurrence of the event is recorded. That is, the time T at each point the event is executed and its details are output to the data file holding section 1D.

(8) The simultaneous state-events search device 58 then searches the simultaneous state-events rule collection 42 by using the frame pointer 32 connecting the token 30 and the state variable 38 of the token as keys (step 714). In this step, a search of the event table 40 is executed based on information, such as the related frame pointer, to find and list all the tokens 30 corresponding to simultaneous state-events with a mark in the waiting state mark area 36, and to load them on the event processing stack 54 in the event processor 56. In the example of FIG. 6, the trans 1 and the operator 1 are in a waiting state at the time T1, and are extracted as simultaneous state-events B1 and E1 for the event A1 of the cell 1.

The cell 2 has been in a waiting state since the time T2, and is extracted as a simultaneous state-event C4 when the trans 1 causes the event B4 to occur.

(9) The tokens 30 which are event processed in step 716 and the tokens in the waiting state are returned to the time event table 40.

(10) The process checks whether or not there are any tokens 30 in the event processing stack 54 (step 718), and if so, returns to the step 711, and repeats the above steps until all the tokens are exhausted. In the example of FIG. 6, each of the above steps is repeated for both of the accidental simultaneous state- events A1 and F1.

When the tokens are exhausted, the process returns to step 702. In the example of FIG. 6, because tokens corresponding to the intentional simultaneous state-events B1 and E1 (at time T1) exist in the time event table 40, by the processing of step 714, the simulation time T is not updated, and processing of these tokens is executed (steps 710–718).

Similarly, in the following, each of the above processing steps is repeated until the time when the simulation is complete.

The event processor 56 sequentially outputs the event processing records of step 713 to the data file holding section 1D, and these records are processed in the data processing section 1E, details of which will be described later.

Now, the details of the event processing executed in the above step 712 will be described for the operation of each object.

(A) Operation of the Production Cell

Operation of the production cell, for each cell, will now be described in detail.

The task of the production cell is to execute a given JOB on a machine. The production cell stores the JOB to be executed by it in a stack.

Figure 8:
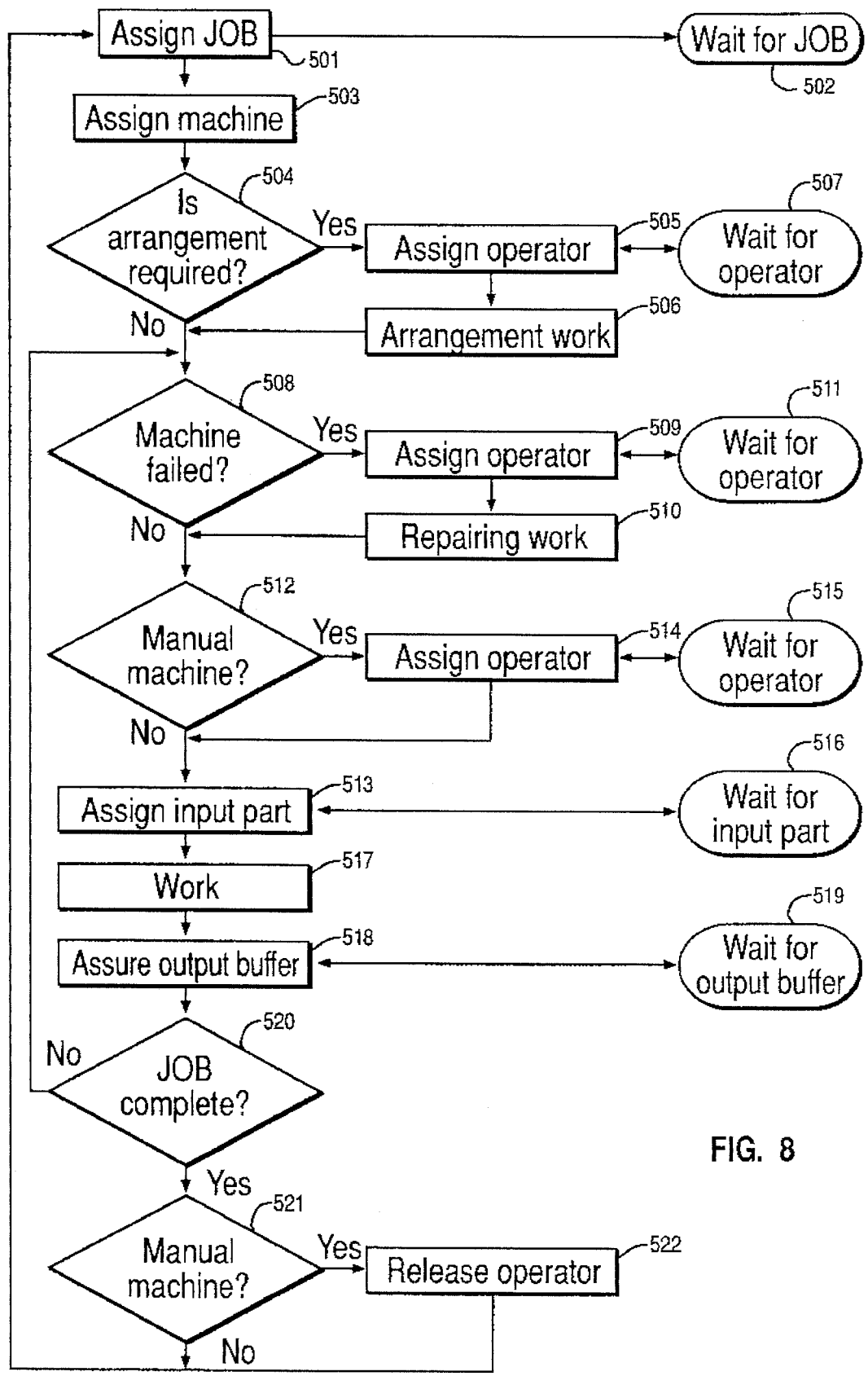

There are two stacks: a schedule job stack and a request job stack. The schedule job stack is a stack in which JOBs, assigned to the production cell by the scheduler or JOBs defined by the JOB sequence, are loaded. On the other hand, the request job stack is a stack in which JOBs requested by the next process through a trans are loaded. Both of them fetch JOBs under the first-in first out (FIFO) rule. Basic operations of the production cell consist of the following steps as shown in FIG. 8:

(1) Taking out JOBs

JOBs are taken out from either the schedule job stack or the request job stack (step 501). In the case where there are JOBs simultaneously in both stacks, the JOB in the request job stack takes preference. If there is no JOB in either stack, the process waits for a JOB in its present (step 502).

(2) Assignment of Machines

An empty machine is searched for, and the taken-out JOB is assigned to that machine (step 503). If there is no empty machine, the process waits for a machine until one becomes empty.

(3) Arrangement Work

The arrangement status of machines is checked (step 504). If the assigned JOB can be executed on the assigned machine, as it is arranged, execution of the JOB is started. Otherwise, the arrangement work necessary for executing the assigned JOB is searched for, and an operable operator is searched for to perform the arrangement work (step 505). When an operator is found, the machine enters into the arrangement work (step 506).

If one is not found, the process waits as it is (step 507).

(4) Checking of Machines

The status of the machine is checked (step 508). If the machine fails, an operator is searched (step 509) to have the repair work performed (step 510). If there is no operator, the process waits (step 511).

(5) Execution of JOBs

The type of machine is determined (step 512). If the machine is an automatic type, the JOB is immediately executed (step 513). If it is a manual type, operators in the number necessary for the operation of the machine are searched for (step 514). That is, a search is made for operators for whom the execution start time of the JOB is within the work time zone of the operators, and for whom operation of the machine is contained in their responsible areas. If the operators are found, the machine starts to execute the JOB. If they are not found, the process waits as it is (step 515).

(6) Execution of Work (6.1) Drawing of Input Parts

The work-in-process necessary to do the work is taken out from a buffer held by the cell, and is loaded in the machine (step 513). The time for loading from the buffer to the machine shall be zero. If there is no necessary work-in-process, the process waits as it is, and turns into an input waiting state (step 516).

(6.2) Work Using the Machine

The machine is operated (step 517).

(6.3) Output to Buffer

The work-in-process completed by the work is unloaded to the buffer held by the cell from the machine (step 518). The time for unloading from the machine to the buffer is not considered. If output cannot be done because the buffer is full, i.e. at capacity, the process waits as it is, and turns into an output waiting state (step 519).

(7) End of JOB

Whether or not the work has been executed the number of times defined by the JOB (step 520) is checked. If the required number of executions has not been reached, the work is executed again (return to (6)). When the number of required work executions has been reached, the JOB ends. If the machine is the manual type (step 521), the operators engaged in the machine operation are released (step 522).

(8) Return to (1)

(B) Operation of Carry-out Cell (1) Operation of the Carry-out Cell of the Order Type Carrying Out System When the inventory quantity in the output buffer becomes less than an inventory reference point, or when it becomes empty, a carry-out instruction is issued. The carry-out instruction presents a carrying-out quantity for each work-in-process. When time expires by the amount of a specified lead time from the time the carry-out instruction was issued, applicable parts are carried out in the presented quantity. If there is insufficient work-in-process to be carried out, the process waits as it is (waiting for output).

(2) Operation of the Carry-out Cell in a Probability Distribution Type Carry-in System The carry-out time is determined according to a predetermined probability distribution. When the carry-out time is reached, pre-presented parts are carried out in the presented quantity. If there is insufficient work-in-process to be carried out, the process waits as it is (waiting for output).

(3) Operation of the Carry-out Cell of the Cyclic Type Carry-in System

The carry-out time is always determined by a cycle at a constant time interval according to a predetermined time interval. The carry-out quantity is determined by the interval and by the work-in-process. When the carry-out time is reached, pre-presented parts are carried out in the presented quantity. If there is insufficient work-in-process to be carried out, the process waits as it is (waiting for output).

(4) Operation of the Carry-out Cell of the Plan Type Carry-in System

Carry-out is performed according to a predefined carry-out schedule. The schedule is defined with a scheduled carry-out time, names of work-in-process to be carried out, and quantity to be carried out. When the scheduled time is reached, applicable work-in-process is carried out in the defined quantity. If there is insufficient work-in-process to be carried out, the process waits as it is (waiting for output).

(C) Operation of the Carry-in Cell (1) Operation of the Order Type Carry-in System When the inventory quantity in the input buffer becomes less than the inventory reference point, or when it becomes empty, a carry-in instruction is issued. The carry-in instruction presents a carrying-in quantity for each work-in-process. When time expires according to the amount of a specified lead time from the time the carry-in instruction was issued, applicable parts are carried in the presented quantity. At that moment, if the input buffer does not have sufficient space, the buffer waits as it is until space becomes available (waiting for input).

(2) Operation of the Carry-in Cell of the Probability Distribution Type Carry-in System The carry-in time is determined according to a predetermined probability distribution. When the carry-in time is reached, pre-presented parts are carried in, in the presented quantity. At that moment, if the input buffer does not have sufficient space, the buffer waits as it is until space becomes available (waiting for input).

(3) Operation of the Carry-in Cell of the Cyclic Type Carry-in System

The carry-in time is always determined by a cycle at a constant time interval according to a predetermined time interval. The carry-in quantity is determined by the interval and by the work-in-process. When the carry-in time is reached, pre-presented parts are carried in, in the presented quantity. At that moment, if the input buffer does not have sufficient space, the buffer waits as it is until space becomes available (waiting for input).

(4) Operation of the Carry-in Cell of the Plan Type Carry-in System

Carry-in is performed according to a predefined carry-in schedule. The schedule is defined with a scheduled carry-in time, the names of work-in-process to be carried in, and the quantity to be carried in. When the scheduled time is reached, applicable work-in-process is carried in, in the defined quantity. At that moment, if the input buffer does not have sufficient space, the buffer waits as it is until space becomes available (waiting for input).

(D) Operation of Trans

The trans has two types: push and pull. The operation differs depending on the type.

(1) Operation of the Push Type Trans

Figure 9:
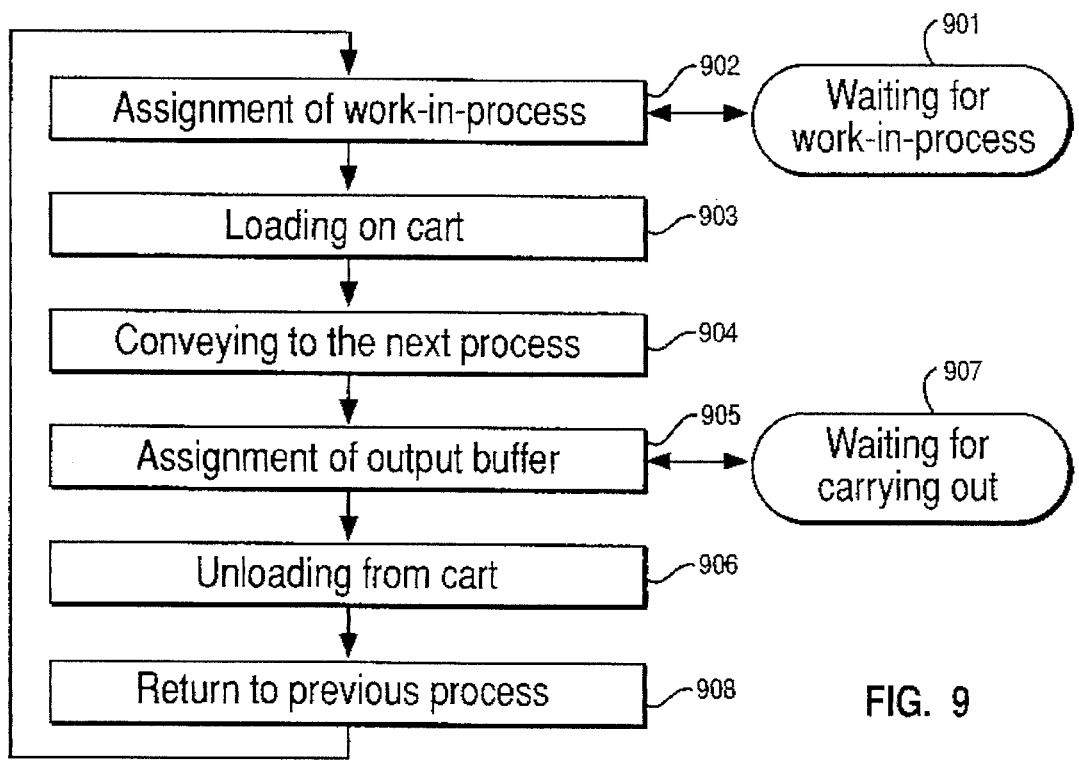
FIGS. 8, 9, and 10 show diagrams illustrating the operations of a production cell, a push type trans, and a pull type trans, respectively, all of which are used for executing the event processing in FIG. 7.

The basic operation of the push type trans is described by referring to FIG. 9.

i) A push type trans usually waits in the upper stream (i.e. at the previous process, step 901).

ii) When work-in-process is prepared in the quantity that can be mounted on the cart (step 902), the work-in-process is loaded on the cart (step 903). At that moment, the required time is the loading time defined in the load time.

iii) Immediately after completion of loading, transporting work is started to carry the work-in-process to the next process (step 904).

iv) The next process is reached. Whether or not the buffer in the next process has a space in which all the work-in-process mounted on the cart can be carried in (step 905) is checked. If so, the work-in-process is carried in to the process (i.e. unloaded at step 906). At that moment, the time required is the loading time as in (ii), above. If no space is availale in the buffer, the process waits until sufficient space becomes available (waiting for carry-in . . . step 907).

v) The trans returns to the previous process in its empty state (step 908).

(2) Operation of Pull Type Trans

Figure 10:
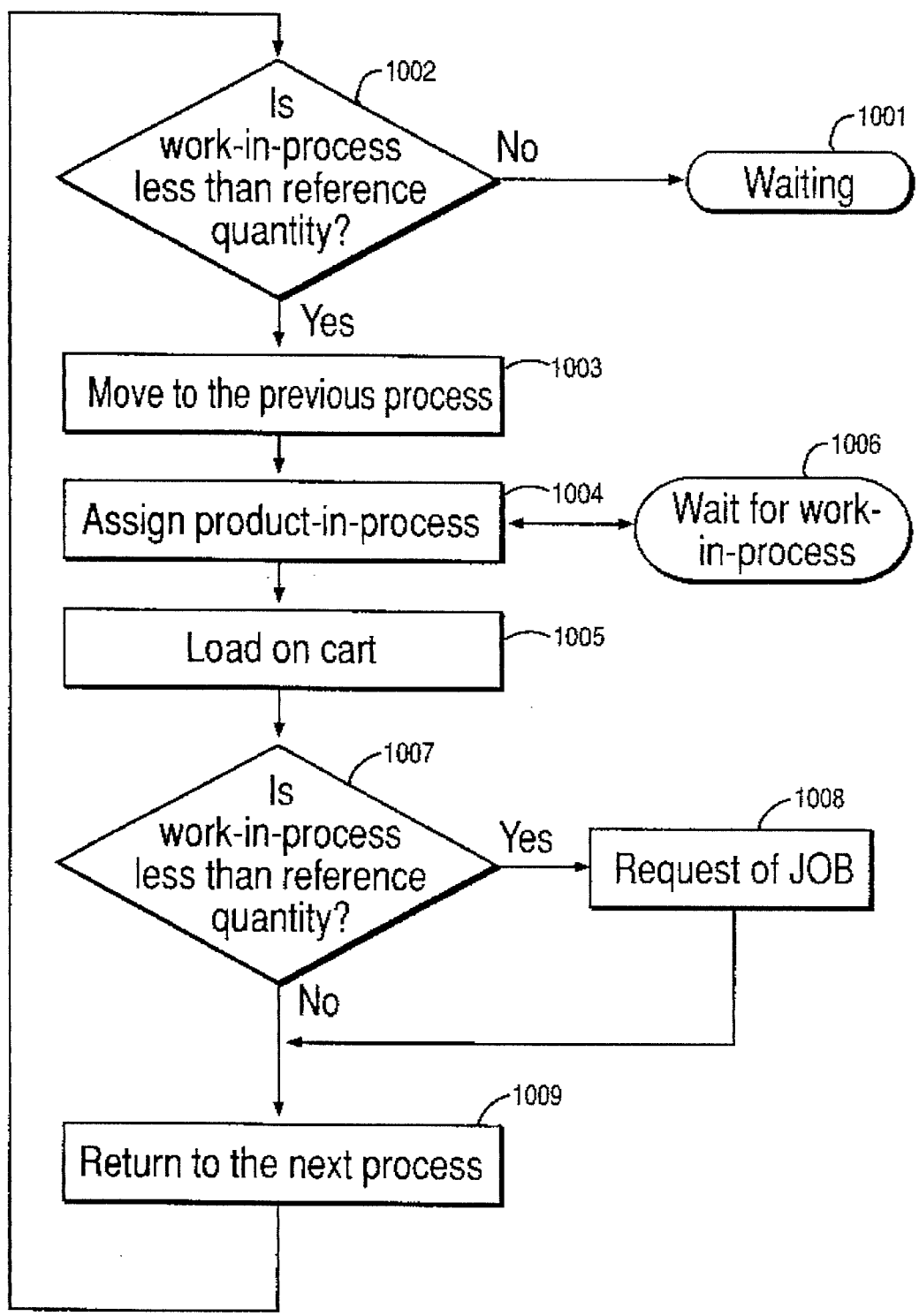

The basic operation of the pull type trans is performed in the following order as shown in FIG. 10.

i) A pull type trans usually waits at the down stream process (i.e. the next process, step 1001).

ii) When the inventory of work-in-process in the buffer at the down stream process becomes less than the reference quantity (step 1002), the trans goes to the upper stream process (the previous process) in its empty state to receive the work-in-process (steps 1003 and 1004). If the reference quantity is not set, the trans goes to the upper stream to receive the products-in-process when the buffer becomes empty.

iii) If in the buffer of the previous process, there is work-in-process in a quantity exceeding the size of the cart, the cart is loade to its capacity (step 1005). At that moment, the time required is the loading time. If there is no work-in-process, the trans requests an applicable JOB of the cell of the previous process, and waits as it is (step 1006).

iv) If the work-in-process is less than the inventory reference quantity after loaded on the cart (step 1007), the trans requests a JOB of the cell of the previous process at that moment (step 1008).

v) Immediately after completion of loading, the conveying work is started in order to convey the work-in-process to the next process (step 1009).

vi) The trans reaches the next process. Whether or not the next process has sufficient space to receive all the work-in-process on the cart is checked. If so, the work-in-process is carried in. At that moment, the time required is the loading time as in (iii), above. If the next process does not have sufficient space, the trans waits until sufficient space becomes available.

(E) Operation of Operator

The operator performs work in response to the request of the cell when machine operation, arrangement work or repair of the machine is required. The operator is set with a work time for each group. If the time when the operator starts work is within the set work time, the work is started. Once the work is started, the process is not interrupted until the work is completed even if the period set for the work time expires during performance the work.

Figure 11:
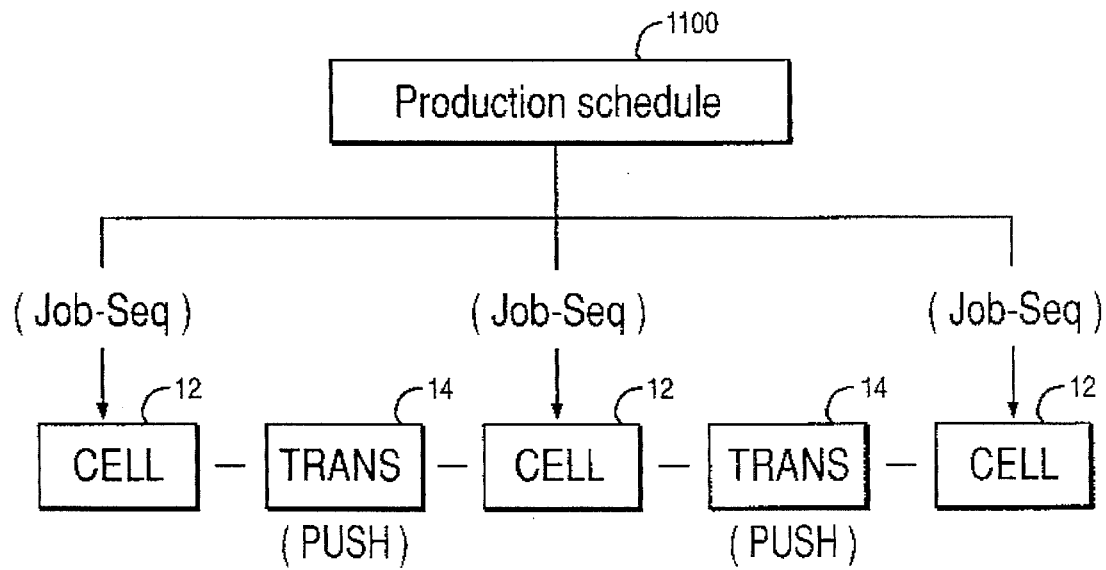
FIGS. 11, 12, and 13 show modelling of a push type production order system, a pull type production order system, and a pull/push mixed type production order system, respectively.

(F) Simulation of Production Ordering System (1) Simulation of a Push Type Production Ordering System To simulate the push type production ordering system, it is necessary and sufficient that the details of the production order be given to each process (what is produced and how many), and that their order of execution be explicitly described. In the simulation system of the invention, the JOB series corresponds to this. As shown in FIG. 11, when it is assumed that all the cells 12 are given a production plan from the scheduler 1100, the production plan represented by the JOB series in the cells. In addition, the trans 14 connecting each cell is set to the push type. The arrangement of JOBs defined by the JOB series is executed in their defined order. If the trans in the down stream is the push type, JOBs are sequentially sent to the next process after processing is completed. That is, the process cell performs the production according to the given plan, and sends the work-in-process to the down stream process.

(2) Simulation of a Pull Type Production Ordering System

Figure 12:
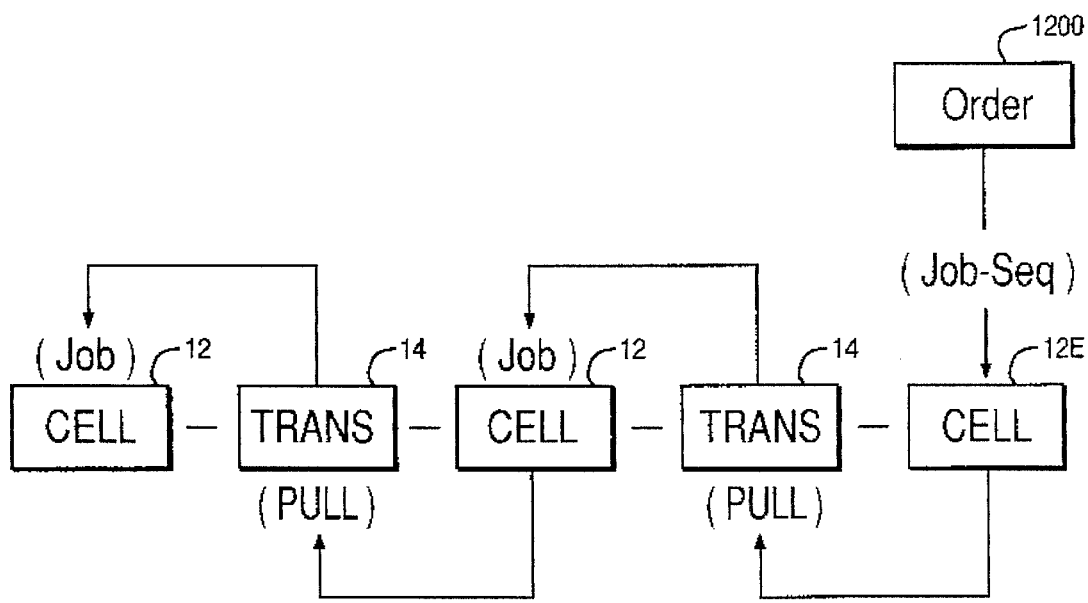

To model the pull type production ordering system, the scheduler 1200 (FIG. 12) corresponding to the shipment plan is set up only in the cell 12E of the final process (a carry-out cell may be used), but no particular JOB series is set up in the remaining cells 12. In addition, all the trans 14 connecting each cell 12 are set to the pull type. When the work-in-process required in the final process becomes less than the inventory reference quantity, the trans connecting to the previous process is initiated. The trans arrives at the previous process to receive the work-in-process, and, if the inventory of the work-in-process is less than the reference quantity (at that moment) the trans requests a JOB of the cell. This chain is repeated to the previous processes, operating across the entire simulated process.

The cart of the pull type trans is usually waiting at the next process, and starts to move to the previous process when the work-in-process to be conveyed becomes less than the inventory reference quantity. When the cart reaches the previous process, it is going to carry out the applicable work-in-process. At that moment, if there is no sufficient work-in-process, the trans makes a JOB request of the previous process that will output the work-in-process. Also, when the remaining quantity becomes less than the inventory reference quantity, after delivery of the work-in-process, similar processing is performed. The cell of the previous process converts a request from the next process into applicable JOBs, and sequentially executes them. The cell of the previous process and the trans cooperate and operate in this manner.

(3) Simulation of a Push/pull Mixed Type Production Order System

Figure 13:
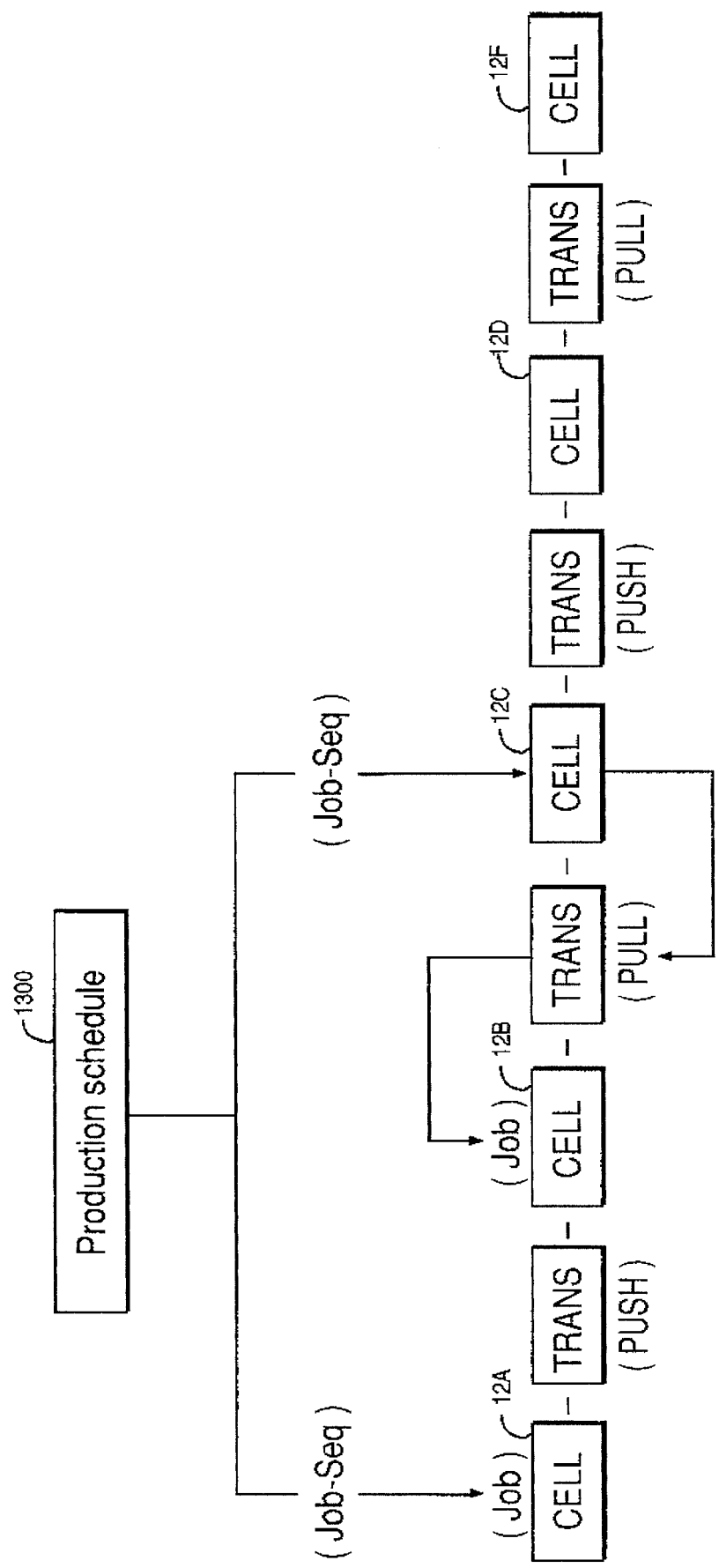

There are various types of push/pull mixed type systems, such as one in which the push type and the pull type are partially mixed, or one that basically receives its production order from the scheduler, but also considers production orders by kanban from the next process, as required. To represent the push/pull mixed type model, it is sufficient to appropriately combine the JOB series and the types of trans as shown in FIG. 13. The production orders from the scheduler 1300 are represented by the JOB series of the cells, and the propagating function of the production order from the next process is represented by the type of trans (e.g. pull type). Because these resources can be independently defined for each process, it is possible to precisely model a JIT (just-in-time) production system that is based on a basic production plan and finely adjusted by kanban. FIG. 13 corresponds to a part of the production line model of FIG. 14 which will be described later. That is, the cell 12A corresponds to the process 200 of FIG. 14, the cell 12B corresponds to the shelf 202, the cell 12C corresponds to the process 204, the cell 12D corresponds to the process 206, and the cell 12F corresponds to the process 208.

The simulation execution section 1C (FIG. 1) executes processing of data for output in an event processing step 712 of FIG. 7, and outputs the results to the data processing section 1E. During execution of the simulation, when an event token 30 encounters the conditions corresponding to the evaluation items of Tables 6 and 7, a statistical operation is conducted with the sampling method shown in Table 8, by using an equation described later. This equation refers to an object frame connecting the token, and to additional information written in the root frame.

TABLE 6

Figure 15:
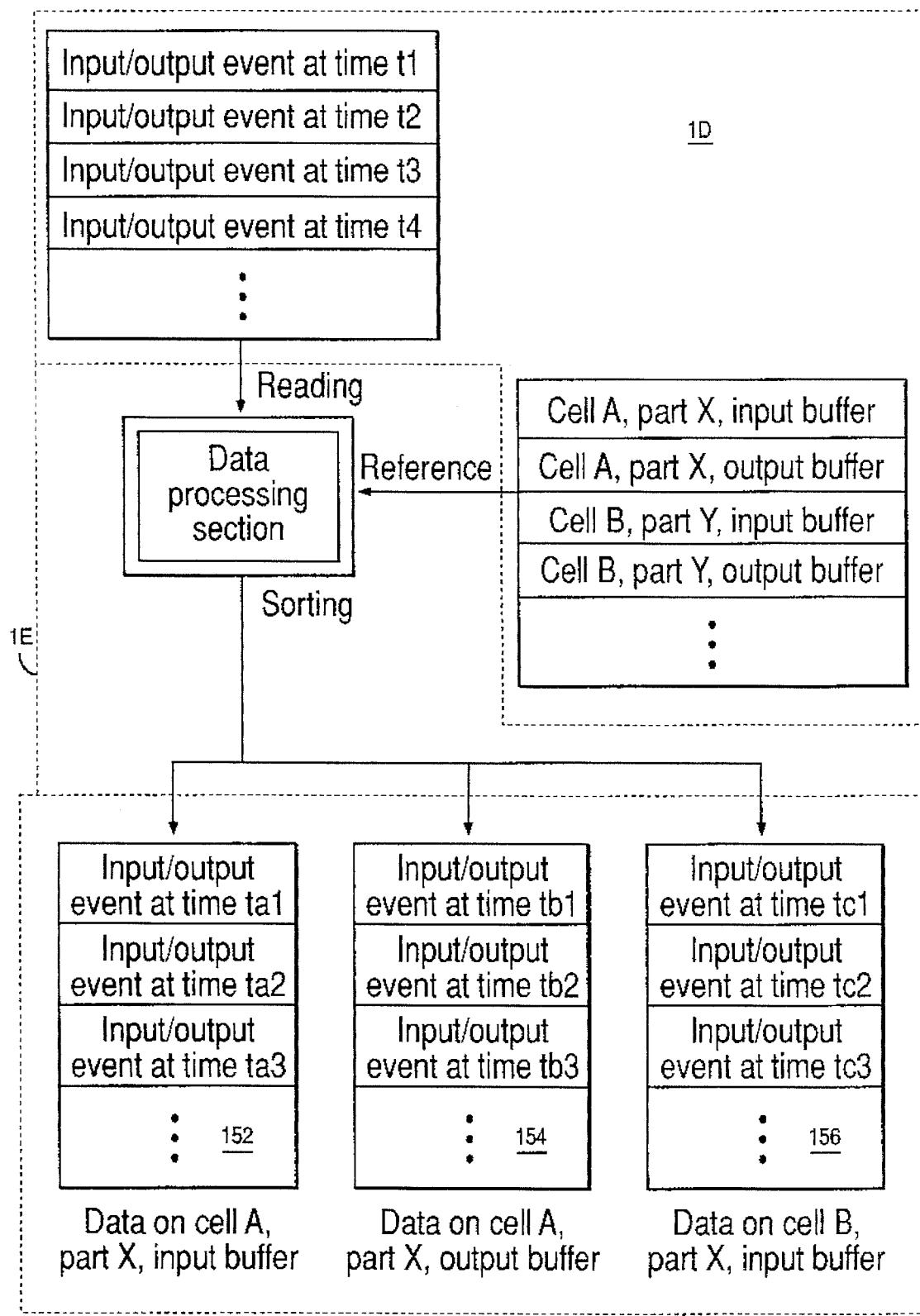
FIG. 15 shows details of a data processing section of the apparatus of FIG. 4.
Figure 16A:
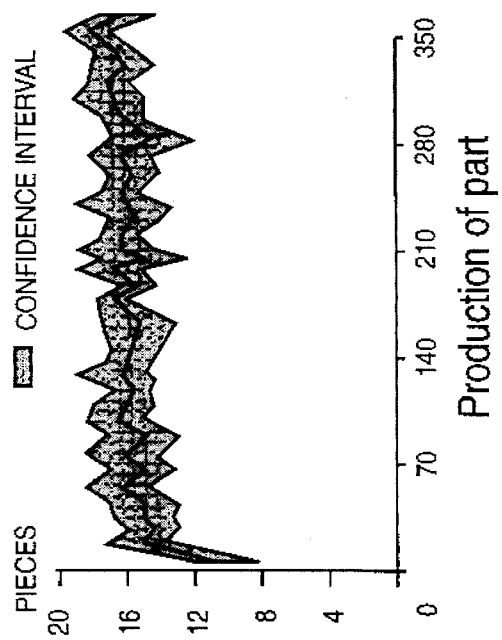
FIG. 16 shows an example of display on an external display device.
Figure 16B:
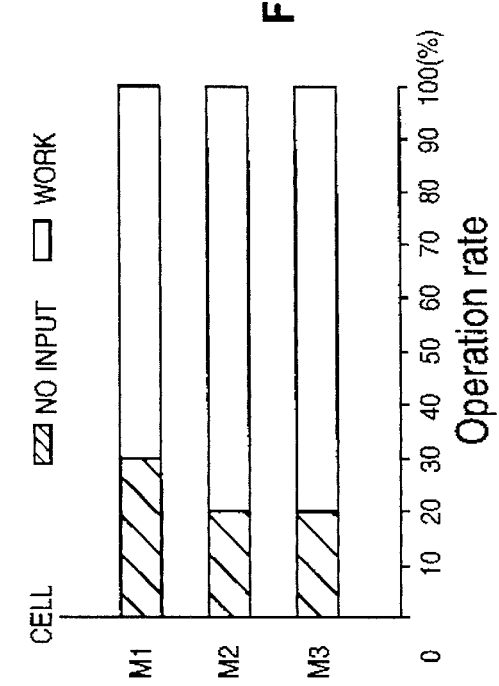
Figure 16C:
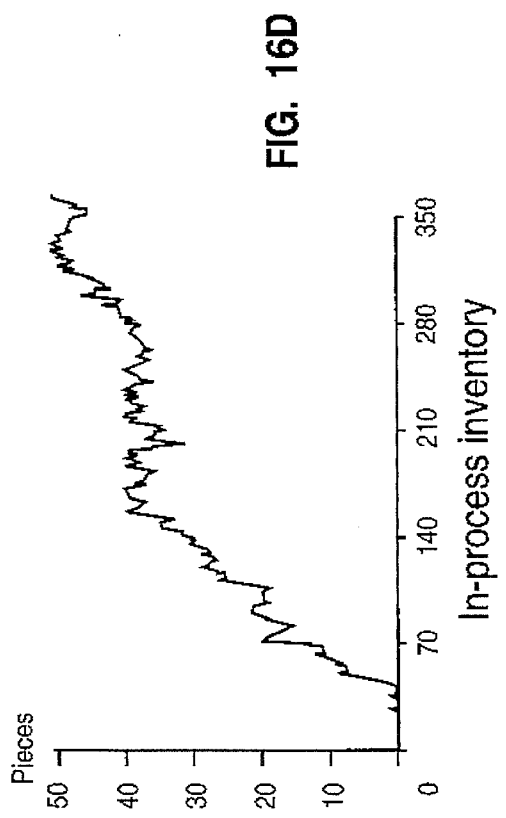
Figure 16D:
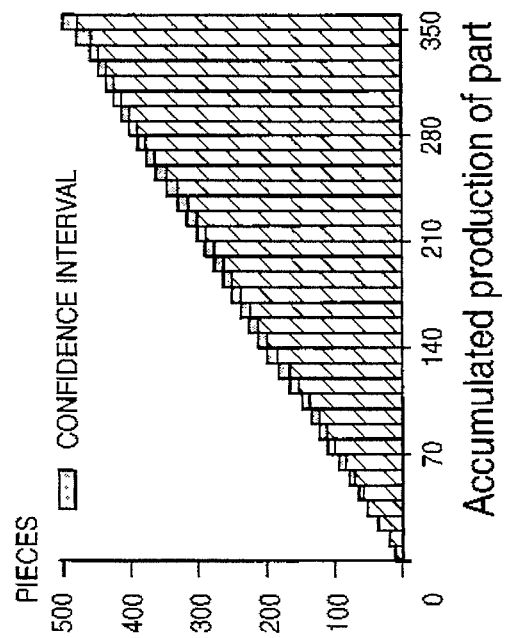

Evaluation items for performance evaluation data (1) Machine defined by the production cell
  - Total operation time
  - Input waiting time
  - Output waiting time
  - Repairing time
  - Arrangement time
  - Worker waiting time for machine operation
  - Worker waiting time for repair and arrangement
(2) Each item of conveying equipment defined by trans
  - Total conveyance time
  - Work time for carry-in and carry-out
  - Carry-in waiting time
  - Carry-out waiting time
(3) Each operator defined by operator
  - Total work time There are two types of data output by the simulation execution section: performance evaluation data; and transition time series data. The data processing section 1E (FIG. 1) performs processing and statistical analysis of this data. The transition time series data includes data in which all events relating to input/output of parts, that occurred during execution of the simulation, are recorded in the order of occurrence. The data processing section records all the input/output events that every object (cell, trans and operator), which exists in the simulation model, causes so that the events are sorted and classified as 152, 154, 156 (FIG. 15) by production cells A and B, by parts X and Y, and by input/output buffers.

According to the invention, an event token 30 can easily detect the root frame and the object frame relating to that token with the bidirectional list and the pointer, and can use this information so that detailed items of simultaneously occurring events can be rapidly evaluated.

Table 7. Evaluation Items for Transition Time Series Data (1) Transition time series data of inventory in the process in each cell by part (2) Transition time series data of cumulative production (3) Transition time series data of production in a time interval Table 8. Sampling Methods for Transition Time Series Data (1) Sampling of data in a constant time interval (2) Sampling of data in an arbitrary time interval (3) Sampling of data on all events relating to input/output of parts The statistical analysis in the data processing section has two roles; one for processing the statistical analysis of performance evaluation data, and the other for processing the transition time series data, for the processing amount and the inventory of work-in-process in each cell. The performance evaluation data and the transition time series data are collected by the independent replication method, and statistically calculated and processed. The evaluated items obtained are an average, a standard deviation, a maximum/minimum value, and a confidence interval. Processing of carry-in/carry-out waiting time of conveying equipment, and transition time series data of the cumulative production amount) are $X_1, \ldots, X_n$.

TABLE 9

Calculation equations for data processing (1) Average: $\bar{X} = (X_1 + \ldots + X_n)/n$
(2) Standard deviation:

$$SD = \sqrt{(SqSumX - SqSumX/n)/(n-1)}$$

where, $SqSumX = (X_1^2 + \ldots + X_n^2)$
(3) Maximum/minimum values:
$X_{max} = MAX(X_1, \ldots X_n)$
$X_{min} = MIN(X_1, \ldots X_n)$
(3) Confidence interval:
Lower limit = $\bar{X} - tn_{-1,1}\text{-}a/2SD^2/n$
Upper limit = $\bar{X} + tn_{-1,1}\text{-}a/2SD^2/n$
where, $tn_{-1,1}\text{-}a/2$ is the upper 1 - a/2 percent point of distribution with the degree of freedom of $n - 1$.

The evaluation items of Table 6 provide data on the operation rates of the cells, the trans, and the operators. In addition, the evaluation items of Table 7 provide data on the production of parts. The data relating to these evaluation items is subjected to several repetitive experiments in order to equally treat the effects of pseudo random numbers. Further, this data is statistically processed by the data processing section, and is output as a numerical report on the simulation results. The example shown in Table 10 is a report on the operation state of the cells over the entire simulation time. The columns indicate the detailed evaluation items regarding the operation rate of the cells, while the rows indicate statistical values.

TABLE 10

Example of report output of simulation results

| CELL:A1 | | | | | | | |
|---|---|---|---|---|---|---|---|
| Item | Mean | (%) | SD | (Minimum | Maximum) | (Lower CI | Upper CI) |
| Cell idling: | 0.00 | (0.0%) | 0.00 | (0.00, | 0.00) | (0.00, | 0.00) |
| Machine: A1111 | | | | | | | |
| Item | Mean | (%) | SD | (Mimimum | Maximum) | (Lower CI | Upper CI |
| No input: | 560.05 | (38.9%) | 75.02 | (484.53, | 634.57) | (433.58, | 686.53) |
| Full output: | 0.00 | (0.0%) | 0.00 | (0.00, | 0.00) | (0.00, | 0.00) |
| Work: | 880.07 | (61.1%) | 75.02 | (805.52, | 955.54) | (753.61, | 1006.54) |
| Recover: | 0.00 | (0.0%) | 0.00 | (0.00, | 0.00) | (0.00, | 0.00) |
| Setup: | 0.00 | (0.0%) | 0.00 | (0.00, | 0.00) | (0.00, | 0.00) |
| Output wait: | 0.00 | (0.0%) | 0.00 | (0.00, | 0.00) | (0.00, | 0.00) |
| Recover wait: | 0.00 | (0.0%) | 0.00 | (0.00, | 0.00) | (0.00, | 0.00) |
| Setup wait: | 0.00 | (0.0%) | 0.00 | (0.00, | 0.00) | (0.00, | 0.00) | these items performed by using the calculation equations of Table 9.

That is, an average can be found, as follows, assuming that data is obtained from n independent replications (such as the above-mentioned total operation time of the machine, The example of Table 11 show the accumaltion of production amounts of parts by the cells versus the transition of the simulation time. The columns indicate the transition time series data of the production of parts for every 60 simulation times, while the rows indicate statistical values.

TABLE 11

| | Simulation time and transition of production of parts | | | | | |
|---|---|---|---|---|---|---|
| Simul. time | Thruput | SD | (Minimum, | Maximum) | (Lower CI, | Upper CI) |
| 60.00: | 173.00 | 11.17 | (155.00, | 189.00) | (166.53, | 179.47) |
| 120.00: | 362.90 | 23.86 | (321.00, | 388.00) | (349.07, | 376.73) |
| 180.00: | 550.70 | 27.66 | (506.00, | 592.00) | (534.66, | 566.74) |
| 240.00: | 743.80 | 32.35 | (690.00, | 792.00) | (725.05, | 762.55) |
| 300.00: | 930.90 | 32.50 | (880.00, | 964.00) | (912.06, | 949.74) |
| 360.00: | 1124.00 | 24.47 | (1089.00, | 1154.00) | (1109.81, | 1138.19) |

The numerical data relating to the above-mentioned evaluation items contains a large amount of valuable information, and it becomes essential to have a means of efficiently and effectively grasping this information as the types of evaluation items become more and more detailed. To this end, an external display 2 (FIG. 1) which is capable of displaying graphics is provided. This graphic display function can disply data either on the evaluation items relating to the operation status of the operators (Table 6) or the evaluation items relating to the production of the parts (Table 7). FIG. 16 (a) graphically shows the evaluation data relating to the operation state of the cells, in which the axis of the ordinate indicates a list of machines, while the axis of the abscissa indicates a ration of each evaluation item relating to the operation rate of each machine for the total simulation time. FIGS. 16 (b) and (c) graphically show the evaluation data on the production of the parts in a cell, in which the axis of the ordinate indicates the production of the parts (the production is the cumulated value in (b), and the interval value in (c)), while the axis of the abscissa indicates the simulation time. FIG. 16 (d) graphically shows the work-in-process inventory of parts in a buffer related to the cell, in which the axis of the ordinate indicates the work-in-process inventory of the parts, and the axis of the abscissa indicates the simulation time.

In order to make the graphic display of the numerical data on the evaluation items more effective, the graphic display function preferably is capable of displaying a plurality of graphics on one screen, i.e. windowing.

Figure 14:
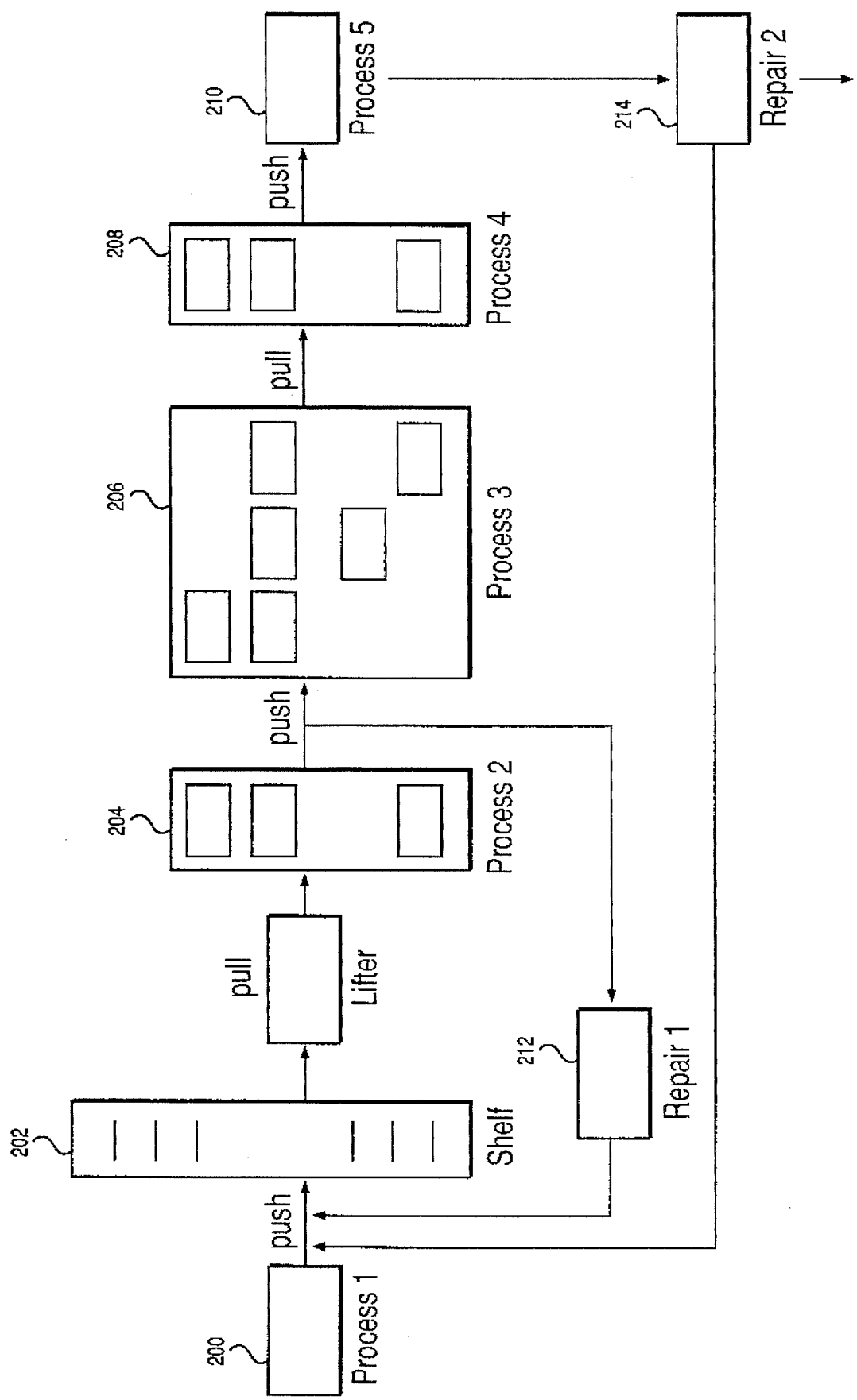
FIG. 14 shows a schematic view of a production line to which the simulation of this invention applies.

As stated above, various evaluation items from the simulation can be simultaneously displayed, so that the user can intuitively understand the diverse meanings of the simulation results, and can utilize these as effective reference data for the validity of the model and for extraction of the features and problems of the system. Furthermore, because analysis results of simulations on different models can be simultaneously displayed, it is possible to easily and effectively compare and evaluate the performance of a plurality of systems. A simulation was performed on an inspection process in order to determine the practicality of the simulation system of this invention. FIG. 14 shows a schematic diagram of that production line.

This production line completes the final assembly work on a process 200, and, after passing through processes 204, 206 and 208, ships the product from a process 210. During this flow, those products found to be defective by the inspection are fed to repairing processes 212 and 214 for rework. Each process has a buffer with a definite size, and each process is installed with plural machines. In addition, the lot size for each process is uniquely determined by each process because of the restrictions of the installed machines. This line has the following features:

(1) It is a large scale system.
(2) It is a multi-product production system.
(3) It has probability branches and rework.

Because each process is an inspection process, the flow of the products to the next process varies, depending on the results of the inspection.

(4) It is a mixture of a push type and a pull type.

As described in connection with FIG. 13, it is a mixed push/pull type system.

(5) It is a mixture of automated processes and manual processes.

(6) It is a shift work type system.

While the automated process is operated 24 hours a day, the manual operation process is 16 hours in two shifts a day.

A simulation model was built for this line for ensuring the reproducibility of the simulation. In the model, a shipment list was created from actual data for the process 200, and was represented as a plan type source node. The final process was represented as an order type carry-in node with a lead time of zero. The processing work time and machine repairing time for each process will follow the above-mentioned shift type exponential distribution, and parameters were estimated from actual data. The branch probability was estimated from past maintenance data. The simulation time was 24 hours, and the items of the work day, when the data was collected, were for a single product.

Figure 17:
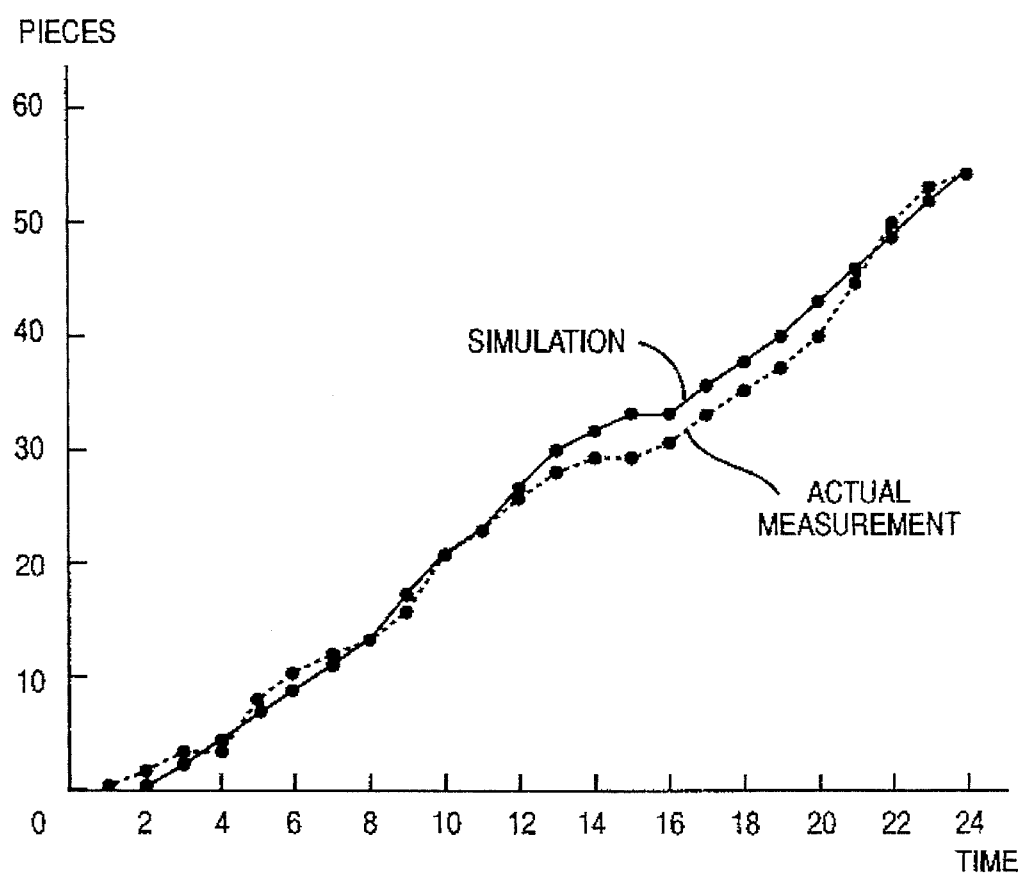
FIG. 17 shows the relationship of production quantity to expiration of time as the results of a simulation that is applied to the production line of FIG. 14.

FIG. 17 shows a comparison of production amounts in the final process between a simulated value for the cumulative estimation for each hour and the actual shipment performance which was actually measured for this process. The simulated value is a plot of averages of simulation results from five independent replication runs. From FIG. 17, it can be understood that the simulation values substantially reproduce the actual values.

According to the embodiment described above, the following advantages can be obtained:

(1) A high speed discrete event simulation can be conducted by efficiently processing simultaneous state-events.

In the simulation apparatus according to the present invention, an accidental simultaneous state-event uses a scheduled occurrence time as a key. An intentional simultaneous state-event uses, a frame index of a given simultaneously occurring event rule to perform a search with an event token so that calculation of simultaneous state-events, which is a bottleneck in discrete event simulation technology, can be very efficiently carried out. In addition, with the conventional simulation languages, processing of the simultaneous state-events depend only on the user of the language, and requires that all processing algorithms be described one after another in a model which requires an enormous amount of time to build. In the case of simulation of a production system, simultaneous events occur very frequently when compared to simulation of a communication network, because there are limitations to the capacity of buffers between the processes, or because the previous process and the subsequent process are operated in synchronization (as in the pull type production instruction system). The simulation technique of this invention is an effective means to solve this problem, and allows very easy description of the processing algorithm of the simultaneous state-events.

(2) The present invention allows very easy building of a simulation model and specification of its parameters.

The descriptive elements of the model are roughly divided into three types; cells (nodes of a production system and nodes of entrance and exit), transporting systems, and operators, all of which correspond to actual resources in the plant. The simulation model of this invention represents the descriptive elements in the form of a table of the descriptive elements wherein, in many cases, the description items correspond to their contents in a one-to-one manner, and are easily described. Each descriptive element is also provided with description types, not only for the means installed in the process such as the machines, the buffers and the arrangement information, but also for the process components relating to the operations of the process, such as a daily production plan, an ordering system and a production ordering system. This enables the present invention to model an actual production system in more detail and more precisely. Description can be made in more detail according to the purpose of the process being described, while default values can be automatically set for particularly specified items. Thus, the present invention can satisfy user demands to obtain results early on, even when a model may be slightly coarse (not described in detail). When the intention is to make a simplified model more detailed, this is easily accomplished, because it is sufficient to change each frame at a lower level. In addition, because setting of the simulation parameters is separated from the building of a model, the present invention can quickly satisfy such cases in which simulations are executed only by changing the conditions of runs (such as in the evaluation of a system before its design).

(3) The present invention enables one to easily represent a production instruction system and an ordering system as a model, and to execute its simulation.

There are descriptive elements, which describe the simulation model and relate to the operations of the process in addition to those relating to the means in the process. These are the JOB sequence and the priorities of the production cells, the push or pull type of trans, and the carry- in/carry-out system of carry-in and carry-out cells. Because these elements are provided as standard model description terms, it is very easy to incorporate the production ordering system and the ordering system in a model.

(4) The present invention enables one to analyze output data in more detail and with more precision.

In evaluation of system resources, such as machines and conveying equipment, data is processed by utilizing a formatted frame group (root, parent, and child frames) with bidirectional lists and pointers so that the evaluation items may be detailed and may be processed at a high speed. In addition, this data is converted into statistical estimation values through several repetitive calculations in order to equally treat the effects of pseudo random numbers, and thus provide high accuracy.

(5) The present invention enables one to obtain easy-to-understand graphic display of simulation output data.

Data is processed by utilizing a formatted frame group with bidirectional lists and pointers so that various evaluation items of a simulation can be simultaneously displayed as graphics. Therefore, the user can intuitively understand the diverse meanings of the results of the simulation, and can utilize these results as effective reference data for the validity of a model, and for extraction of the features and problems of the system.

As described above, a simulation method is explained by exemplifying a production process system. However, this invention can apply to an automated warehouse system, a physical distribution system, a transportation system covering electric trains, airplanes, or the like.

For example, in a physical distribution system, the warehouses, plants, stores and the like correspond to the cells, the trucks to the trans, and the drivers and workers to the operators. When the stock in a store becomes less than a predetermined amount, a series of events, configured as simultaneous state-events is processed in order for the warehouse and the plant to supply goods. In an automated warehouse system, the warehouses correspond to the cells, the conveying devices and robots to the trans, and the workers to the operators. When a warehouse becomes full, events, configured as simultaneous state-events, are processed in order to deliver goods to other empty warehouses.

In an airport managing system, the airplanes and runways correspond to the cells, the transport means, such as passenger buses, to the trans, and the drivers and workers to the operators. As the airplanes depart or arrive, a series of events, configured as simultaneous state-events, is processed and implemented to occur through the trans and the operators. In addition, this invention can extensively apply to areas covering discrete events, such as control of a circular type ATM in a bank, or a management game. Furthermore, the simulation modelling structure of this invention can be extensively utilized in the modelling of the simulation of a complicated system, and is not limited to a discrete event type simulation.

This invention enables one to easily describe the processing algorithm for simultaneous state-events, and to perform a high speed simulation by efficiently processing the simultaneous state-events. In addition, even for a complicated system, a simulation model can be easily built.

Although certain embodiments have been shown and described, it should be understood that many changes and modifications may be made therein without departing from the scope of the appended claims.

What is claimed is:

1. A data processing system for modelling a simulation of a process having object frames that cause events which are representative of changes in the state of said object frames, comprising:

means for storing said object frames for describing information relating to events;

means for storing a root frame, including a pointer group pointing to a list of said object frames, for describing information relating to conditions of events described in said object frames, and for describing a predetermined sequence of time periods for simulating said process;

a plurality of event tokens connected to said object frames with bidirectional list pointers, each one of said event tokens representing an event described in a corresponding one of said object frames;

a time event table for storing said event tokens;

a stack generator for searching for an object frame that causes an event at the next sequential time period by referring to the sequence of times within said root frame;

means for executing the event within said object frames connected to said event tokens;

means for providing the event token corresponding to said located object frame to be loaded on a token stack;

means for searching for an event occurring simultaneous in time with said loaded event token;

means for determining, using a simultaneous event rules collection, an event intended to occur simultaneously in time with said loaded event token, as a result of executing said represented event;

means for loading event tokens corresponding to said represented event and said intended simultaneous event on said token stack; and means for processing the object frames corresponding to all of the event tokens loaded on said token stack such that said simultaneous and said intended simultaneous events occur.

2. A system according to claim 1 further comprising:

means for setting a waiting state mark in said event token when said represented event cannot be executed;

means for listing, using said simultaneous event rules collection, events occurring simultaneously with said events represented by said marked event tokens; and means for loading said marked event tokens on said token stack.

3. A system according to claim 2 further comprising:

means for recording the outcome of said processing of said object frames by tracing the bidirectional list pointer of the event token corresponding to said object frame; and means for performing statistical processing on said recorded outcome.

4. A system according to claim 3 wherein said means for performing statistical processing comprises:

data processing means for performing said statistical processing by tracing the bidirectional list of the event token corresponding to one of said object frames, and by utilizing said information within said one of said object frames; and means for displaying the statistically processed outcome on an external display device.

5. A method, implemented on a data processing apparatus, of modelling a system to be simulated, said modeled system configured by a plurality of object frames that cause events, which are representative of changes in the state of said object frames, said method comprising the steps of:

modelling said system by inputting and storing information, relating to said events to be simulated, in a first and a second object frame;

describing information relating to timing and conditions of the simulation in a pointer group of a root frame;

creating a first event token and a second event token for representing events of said first and second object frames, respectively;

searching for a first event occurring at a time prescribed by said root frame;

executing, in response to locating said first event in said first event token, processing of said first object frame;

searching a simultaneous event rules collection using said first event token to locate a second event intended to occur simultaneous in time as said first event as a result of executing said first event; and executing, in response to locating said second event in said second token, said second object frame.

6. A method according to claim 5 further comprising the step of providing a time event table for storing said first and second event tokens.

7. An apparatus for modelling a simulation of a process having object frames that cause events which are representative of changes in the state of said object frames, said apparatus comprising:

means for storing information relating to said events in said object frames, each one of said object frames including:

means for representing resources within said process;

means for representing a transportation system interconnecting each of said means for representing resources; and means for representing workers within said process;

means for storing information relating to timing and conditions of said events, described in said object frames, in a root frame, said root frame including:

means, including a pointer group, for pointing to a list of said object frames;

means, including a plurality of event tokens with bidirectional list pointers, for connecting said root frame with said object frames; and means, including a time event table, for storing said event tokens;

means for locating an event occurring at a time described by said information in said root frame;

means for determining, using a simultaneous event rules collection, an event intended to occur simultaneously in time with said located event as a result of executing said located event; and means for processing said object frames corresponding to said located event and said simultaneous event such that said located and simultaneous events occur.

8. An apparatus according to claim 7 further comprising means for describing the interconnection between said means for representing a transportation system and said means for representing resources as a push type or a pull type.

9. An apparatus according to claim 7 wherein said means for representing resources comprises:

means for describing a production process within said process being simulated;

means for describing said resources as a carry-in cell or a carry-out cell;

means for describing the interconnection between said means for representing a transportation system and said means for representing resources as a push type or a pull type; and means for describing an interface between said means for representing resources as a warehouse.

10. A computer program product for use with a data processing apparatus, said computer program product comprising:

a computer usable medium having computer readable program code means embodied in said medium for modelling a system to be simulated, said modeled system configured by a plurality of object frames that cause events, which are representative of changes in the state of said object frames, said computer readable program code means comprising:

computer readable program code means for modelling said system by inputting and storing information, relating to said events to be simulated, in a first and a second object frame;

computer readable program code means for describing information relating to timing and conditions of the simulation in a pointer group of a root frame;

computer readable program code means for creating a first event token and a second event token for representing events of said first and second object frames, respectively;

computer readable program code means for searching for a first event occurring at a time prescribed by said root frame;

computer readable program code means for executing, in response to locating said first event in said first event token, processing of said first object frame;

computer readable program code means for searching a simultaneous event rules collection using said first event token to locate a second event intended to occur simultaneous in time as said first event as a result of executing said first event; and computer readable program code means for executing, in response to locating said second event in said second token, said second object frame.

11. The computer program product of 10 wherein said computer readable program code means further comprises:

computer readable program code means for providing a time event table for storing said first and second event tokens.

12. A computer program product for use with a data processing apparatus, said computer program product comprising:

a computer usable medium having computer readable program code means embodied in said medium for modelling a simulation of a process having object frames that cause events which are representative of changes in the state of said object frames, said computer readable program code means including:

computer readable program code means for storing information relating to said events in said object frames, each one of said object frames including:

means for representing resources within said process;

means for representing a transportation system interconnecting each of said means for representing resources; and means for representing workers within said process;

computer readable program code means for storing information relating to timing and conditions of said events, described in said object frames, in a root frame, said root frame including:

means, including a pointer group, for pointing to a list of said object frames;

means, including a plurality of event tokens with bidirectional list pointers, for connecting said root frame with said object frames; and means, including a time event table, for storing said event tokens;

computer readable program code means for locating an event occurring at a time described by said information in said root frame;

computer readable program code means for determining, using a simultaneous event rules collection, an event intended to occur simultaneously in time with said located event as a result of executing said located event; and computer readable program code means for processing said object frames corresponding to said located event and said simultaneous event such that said located and simultaneous events occur.

13. The computer program product of claim 12 wherein said computer readable program code means further comprises:

computer readable program code means for describing the interconnection between said means for representing a transportation system and said means for representing resources as a push type or a pull type.

14. The computer program product of claim 12 wherein said computer readable program code means for representing resources includes:

computer readable program code means for describing a production process within said process being simulated;

computer readable program code means for describing said resources as a carry-in cell or a carry-out cell;

computer readable program code means for describing the interconnection between said means for representing a transportation system and said means for representing resources as a push type or a pull type; and computer readable program code means for describing an interface between said means for representing resources as a warehouse.

* * * * *